United States Patent
Kuo et al.

(10) Patent No.: US 12,336,298 B1
(45) Date of Patent: Jun. 17, 2025

(54) ELECTROSTATIC DISCHARGE PROTECTION STRUCTURE, SEMICONDUCTOR POWER DEVICE AND MANUFACTURING METHOD THEREOF

(71) Applicant: Diodes Incorporated, Plano, TX (US)

(72) Inventors: Ta-Chuan Kuo, New Taipei (TW); Chia-Wei Hu, New Taipei (TW); Wan-Yu Kai, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/796,069

(22) Filed: Aug. 6, 2024

(51) Int. Cl.
  H01L 27/02 (2006.01)
  H10D 89/60 (2025.01)

(52) U.S. Cl.
  CPC ................ H10D 89/611 (2025.01)

(58) Field of Classification Search
  CPC .. H10D 89/611; H10D 89/817; H10D 89/911; H10D 89/601; H01L 23/60–62
  See application file for complete search history.

(56) References Cited

U.S. PATENT DOCUMENTS

| | | | |
|---|---|---|---|
| 7,956,410 B2 | 6/2011 | Hsieh | |
| 8,004,009 B2 | 8/2011 | Hsieh | |
| 2007/0176239 A1* | 8/2007 | Hshieh | H10D 30/665 257/E29.026 |
| 2009/0140333 A1* | 6/2009 | Pan | H10D 84/148 257/334 |
| 2009/0166740 A1* | 7/2009 | Bhalla | H10D 30/668 438/237 |
| 2010/0289073 A1* | 11/2010 | Hsieh | H10D 84/148 257/E21.546 |
| 2013/0234238 A1* | 9/2013 | Hsieh | H10D 30/0297 438/481 |
| 2014/0183627 A1* | 7/2014 | Ma | H10D 89/611 257/334 |

FOREIGN PATENT DOCUMENTS

CN 100502002 C * 6/2009 ......... H01L 27/0255

* cited by examiner

Primary Examiner — Victor A Mandala
Assistant Examiner — Lawrence C Tynes, Jr.
(74) Attorney, Agent, or Firm — AP3 Law Firm PLLC; Hong Zou

(57) ABSTRACT

An electrostatic discharge protection structure in a semiconductor device includes a first trench structure including a first polysilicon structure and a first oxide layer surrounding the first polysilicon structure. A second trench structure includes a second polysilicon structure and a second oxide layer surrounding the second polysilicon structure. A first diode string is disposed between the first trench structure and the second trench structure and adjoins the first polysilicon structure and the second polysilicon structure. A first spacing oxide layer is disposed on the first diode string. A second diode string is disposed on the first spacing oxide layer and connected in parallel with the first diode string. Each of the first and the second diode strings includes first doped regions and second doped regions disposed alternately. A PN junction is formed at an interface between each first doped region and an adjacent second doped region.

20 Claims, 36 Drawing Sheets

ELECTROSTATIC DISCHARGE PROTECTION STRUCTURE, SEMICONDUCTOR POWER DEVICE AND MANUFACTURING METHOD THEREOF

CROSS-REFERENCE TO RELATED APPLICATIONS

This patent application claims priority to Chinese Patent Application No. CN 202410126085.1, filed on Jan. 30, 2024 and entitled "ELECTROSTATIC DISCHARGE PROTECTION STRUCTURE, SEMICONDUCTOR POWER DEVICE AND MANUFACTURING METHOD OF SEMICONDUCTOR POWER DEVICE," which is hereby incorporated by reference herein as if reproduced in its entirety.

TECHNICAL FIELD

The present disclosure relates generally to the field of semiconductor devices, and in particular, to techniques and mechanisms for an electrostatic discharge protection structure, a semiconductor power device and a semiconductor power device manufacturing method. Particular embodiments provide a trench-type semiconductor power device having an electrostatic discharge protection structure and a method for manufacturing the same.

BACKGROUND

Semiconductor power devices are widely used in the field of electronics. Trench power devices are one of the most popular power switching devices, where a gate oxide layer is grown on the sidewall of a gate trench and filled with polysilicon to form a gate. Trench power devices can improve the utilization efficiency of the device area, so that a larger device unit channel width can be obtained per unit area, thereby achieving a greater current conduction capability. Semiconductor power devices are susceptible to voltage spikes caused by electrostatic discharge (ESD) events. The instantaneous high current and voltage caused by ESD events can cause the gate oxide layer of trench power devices to be broken down, resulting in damage, and even burn-out or high leakage. Therefore, semiconductor power devices need to have ESD protection functions.

SUMMARY

Technical advantages are generally achieved, by embodiments of this disclosure which describe an electrostatic discharge protection structure, a semiconductor power device and a semiconductor power device manufacturing method.

Embodiments of the present disclosure relate to an electrostatic discharge protection structure. The electrostatic discharge protection structure includes: a first trench structure, a second trench structure, a first diode string, a first spacing oxide layer, and a second diode string. The first trench structure includes a first polysilicon structure and a first oxide layer surrounding the first polysilicon structure. The second trench structure includes a second polysilicon structure and a second oxide layer surrounding the second polysilicon structure. The first diode string is adjacent to the first polysilicon structure and the second polysilicon structure, and is arranged between the first trench structure and the second trench structure. The first spacing oxide layer is arranged on the first diode string. The second diode string is arranged on the first spacing oxide layer, and is arranged in parallel with the first diode string.

Embodiments of the present disclosure relate to a semiconductor power device. The semiconductor power device includes: a substrate, a lightly doped layer, a first trench structure, a source doped region, an interlayer dielectric layer, a source electrode, a gate electrode and an electrostatic discharge protection structure. The lightly doped layer is disposed on the substrate. The first trench structure is disposed in the lightly doped layer and extends toward the substrate. The first trench structure includes a first polysilicon structure and a first oxide layer surrounding the first polysilicon structure. The source doped region is disposed in the lightly doped layer and is away from the substrate. The interlayer dielectric layer is disposed on the lightly doped layer. The source electrode is coupled to the source doped region. The gate electrode is coupled to the first polysilicon structure. The electrostatic discharge protection structure is disposed in the interlayer dielectric layer, and includes a first diode string, a second diode string and a first spacing oxide layer. The second diode string is disposed on the first diode string. The first spacing oxide layer is disposed between the first diode string and the second diode string. The first diode string and the second diode string are arranged in parallel between the source electrode and the gate electrode.

Embodiments of the present disclosure relate to a method of manufacturing a semiconductor power device. The manufacturing method includes: forming a lightly doped layer on a substrate; forming, on the lightly doped layer, a first opening, a second opening and a third opening extending toward the substrate; forming a first diode string on the second opening and the third opening; forming a first spacing oxide layer on the first diode string and surrounding the first diode string; forming a second diode string on the first spacing oxide layer; forming a first trench structure in the first opening, wherein the first trench structure includes a first polysilicon structure and a first oxide layer surrounding the first polysilicon structure; forming a source doped region in the lightly doped layer, wherein the source doped region is disposed between the first trench structure and the second opening; and forming a source electrode coupled to the source doped region and forming a gate electrode coupled to the first polysilicon structure. The first diode string and the second diode string are arranged in parallel between the source electrode and the gate electrode.

In accordance with one aspect of the present disclosure, an electrostatic discharge protection structure is provided for use in semiconductor devices. The electrostatic discharge protection structure includes: a first trench structure comprising a first polysilicon structure and a first oxide layer surrounding the first polysilicon structure; a second trench structure comprising a second polysilicon structure and a second oxide layer surrounding the second polysilicon structure; a first diode string, disposed between the first trench structure and the second trench structure and adjoining the first polysilicon structure and the second polysilicon structure; a first spacing oxide layer, disposed on the first diode string; and a second diode string, disposed on the first spacing oxide layer, wherein the second diode string and the first diode string are connected in parallel.

In accordance with another aspect of the present disclosure, a semiconductor power device is provided that includes: a lightly doped layer disposed on a substrate; a first trench structure, disposed in the lightly doped layer and extending toward the substrate, wherein the first trench structure comprises a first polysilicon structure and a first oxide layer surrounding the first polysilicon structure; an interlayer dielectric layer disposed on the lightly doped layer; a source electrode coupled to a source doped region that is disposed in the lightly doped layer; a gate electrode coupled to the first polysilicon structure; and an electrostatic discharge protection structure disposed in the interlayer dielectric layer. The electrostatic discharge protection structure includes: a first diode string; a second diode string, disposed over the first diode string, wherein the second diode string and the first diode string are connected in parallel between the source electrode and the gate electrode; and a first spacing oxide layer, disposed between the first diode string and the second diode string.

In accordance with another aspect of the present disclosure, a method of manufacturing a semiconductor power device is provided that includes: forming a lightly doped layer on a substrate; forming, on the lightly doped layer, a first opening, a second opening and a third opening extending toward the substrate; forming a first diode string over the second opening and the third opening; forming a first spacing oxide layer on the first diode string, the first spacing oxide layer surrounding the first diode string; forming a second diode string on the first spacing oxide layer; forming a first trench structure in the first opening, wherein the first trench structure comprises a first polysilicon structure and a first oxide layer surrounding the first polysilicon structure; forming a source doped region in the lightly doped layer, wherein the source doped region is disposed between the first trench structure and the second opening; forming a source electrode coupled to the source doped region; and forming a gate electrode coupled to the first polysilicon structure, wherein the first diode string and the second diode string are connected in parallel and between the source electrode and the gate electrode.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of several embodiments of the present disclosure may be best understood when the following detailed description is read in conjunction with the accompanying drawings. It should be noted that various structures may not be drawn to scale. In fact, the dimensions of various structures may be arbitrarily enlarged or reduced for clarity of discussion.

For a more complete understanding of the present disclosure, and the advantages thereof, reference is now made to the following descriptions taken in conjunction with the accompanying drawings, in which.

The same or similar components are marked with the same reference numerals in the drawings and detailed description. Several embodiments of the present disclosure will be immediately understood from the following detailed description in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
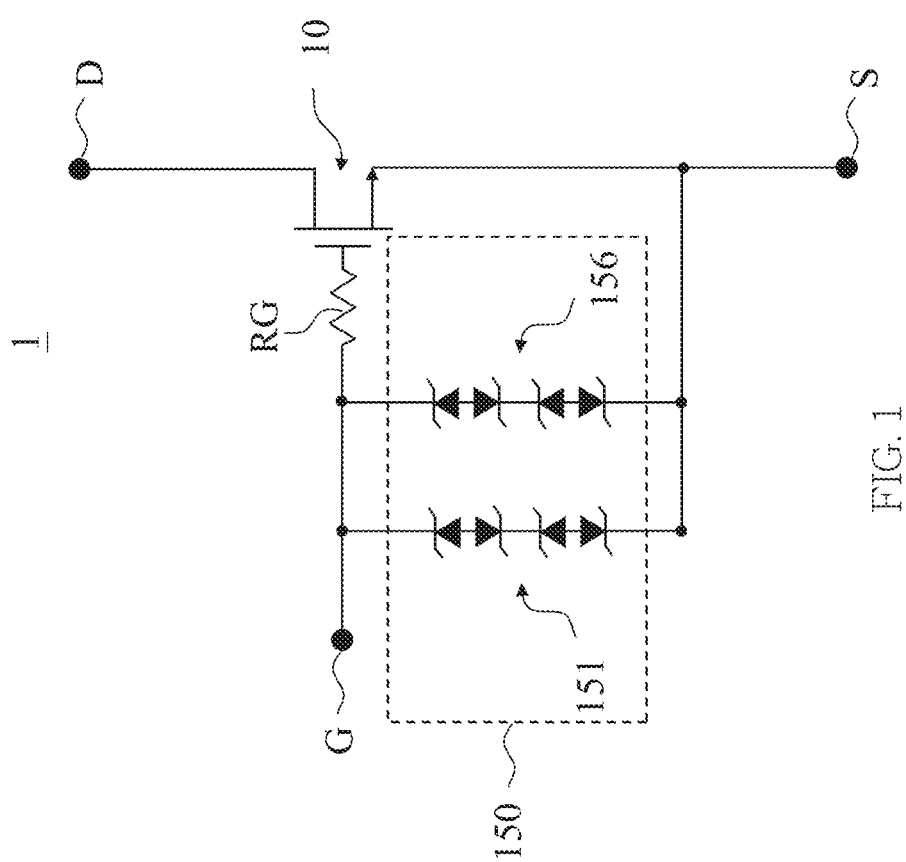
FIG. 1 is a circuit diagram of an example semiconductor power device according to embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood to be within the scope of this disclosure. It is therefore intended that the appended claims encompass any such modifications or embodiments.

The present disclosure will be described with respect to embodiments in a specific context, namely an electrostatic discharge protection structure, a semiconductor power device and a semiconductor power device manufacturing method. The present disclosure may be applied, however, to a variety of semiconductor devices. Hereinafter, various embodiments will be explained in detail with reference to the accompanying drawings.

The following disclosure provides many different embodiments or examples for implementing different features provided. Specific examples of components and configurations are described below. Certainly, these are only examples and are not intended to be limiting. In the present disclosure, references to forming a first feature above or on a second feature may include embodiments in which the first feature and the second feature are formed to be in direct contact, and may also include embodiments in which additional features may be formed between the first feature and the second feature so that the first feature and the second feature may not be in direct contact. In addition, the present disclosure may repeat reference numerals and/or letters in various examples. This repetition is for simplicity and clarity, and does not itself indicate the relationships between the various embodiments and/or configurations discussed.

The following is a detailed discussion of embodiments of the present disclosure. However, it should be understood that the present disclosure provides many applicable concepts that can be embodied in a variety of specific environments. The specific embodiments discussed are merely illustrative and do not limit the scope of the present disclosure.

The present disclosure provides an electrostatic discharge protection structure. The electrostatic discharge protection structure uses a stacking design, so that multiple diode strings for releasing instantaneous large currents can be arranged in parallel with each other according to the stacking structure, which does not occupy additional circuit area (footprint), and also increases the amount of conductible current of electrostatic discharge. Compared with a general electrostatic discharge protection structure, the electrostatic discharge protection structure of the present disclosure can have more diode strings on the same circuit area for releasing instantaneous large currents, thereby having a greater electrostatic discharge protection capability.

The present disclosure further provides a semiconductor power device and a manufacturing method thereof. The semiconductor power device includes the electrostatic discharge protection structure described above, which, compared with a general semiconductor power device, can contain more diode strings on the same circuit area for releasing instantaneous large current, and has a greater electrostatic discharge protection capability.

FIG. 1 is a circuit diagram of a semiconductor power device 1 according to some embodiments of the present disclosure. The semiconductor power device 1 has a gate electrode G, a drain electrode D, and a source electrode S (which may also be referred to as a gate terminal G, a drain terminal D, and a source terminal S, respectively), and includes a power transistor, a gate resistor RG, and an electrostatic discharge protection structure 150. In some embodiments, the power transistor may be a vertical power transistor 10. The power transistor 10 may be a semiconductor power device of various types or manufactured by different technologies. The source and drain of the power transistor 10 are connected to the source electrode S and the drain electrode D, respectively. The gate of the power transistor 10 is coupled to the gate electrode G via the gate resistor RG. The electrostatic discharge protection structure 150 is coupled between the gate electrode G and the source electrode S.

In the embodiment of FIG. 1, the power transistor 10 is an N-type transistor. However, the present disclosure is not limited thereto, and in other embodiments, the power transistor 10 may be a P-type transistor.

In some embodiments, the electrostatic discharge protection structure 150 includes a plurality of diode strings, which are coupled in parallel between the gate electrode G and the source electrode S. Each diode string includes a plurality of back-to-back diodes connected in series. In some embodiments, each diode string has the same configuration.

In the embodiment of FIG. 1, the electrostatic discharge protection structure 150 may include a diode string 151 and a diode string 156, and the diode string 151 and the diode string 156 each may include two back-to-back diodes. It should be understood that the present disclosure uses the number of the diode strings and the number of the back-to-back diodes as shown in FIG. 1 for illustration purpose only, the present disclosure is not limited thereto, and various numbers of diode strings and various numbers of back-to-back diodes may be included in the electrostatic discharge protection structure 150, which are within the scope of the present disclosure.

The number of the back-to-back diodes in a single diode string determines the withstand voltage of the electrostatic discharge protection structure 150, and the number of the diode strings connected in parallel determines the amount of the conductible current of the electrostatic discharge protection structure 150. The electrostatic discharge protection structure 150 may be regarded as a current path, the number of back-to-back diodes in a single diode string may determine the conduction voltage threshold, and the number of diode strings connected in parallel may determine the width of the current path.

In some embodiments, the number of the back-to-back diodes may be determined by the withstand voltage of the semiconductor power device 1, such as the breakdown voltage of the gate oxide layer of the power transistor 10. More specifically, when an electrostatic discharge event occurs, the gate resistor RG can prevent the instantaneous large current, which is generated by the electrostatic discharge event from the gate electrode G, from directly attacking the gate (e.g., the gate oxide) of the power transistor 10, and the instantaneous large current can flow to the source electrode S through the electrostatic discharge protection structure 150 so as to be transferred away from the power transistor 10. In some embodiments, the source electrode S may be coupled to a ground terminal, and thus the instantaneous large current caused by the electrostatic discharge event can flow to the ground terminal through the electrostatic discharge protection structure 150. In other words, when an electrostatic discharge event occurs, the gate resistor RG and the electrostatic discharge protection structure 150 can provide electrostatic discharge protection for the power transistor 10. However, for the electrostatic discharge protection structure 150 to work, a condition needs to be satisfied that the withstand voltage of the electrostatic discharge protection structure 150 is less than the breakdown voltage of the gate oxide layer of the power transistor 10. When the voltage caused by the instantaneous large current reaches the withstand voltage of the electrostatic discharge protection structure 150 first, the electrostatic discharge protection structure 150 can be turned on, and the current will not flow to the gate of the power transistor 10. Therefore, the number of the back-to-back diodes in each diode string is limited by the breakdown voltage of the gate oxide layer of the power transistor 10.

Figure 2:
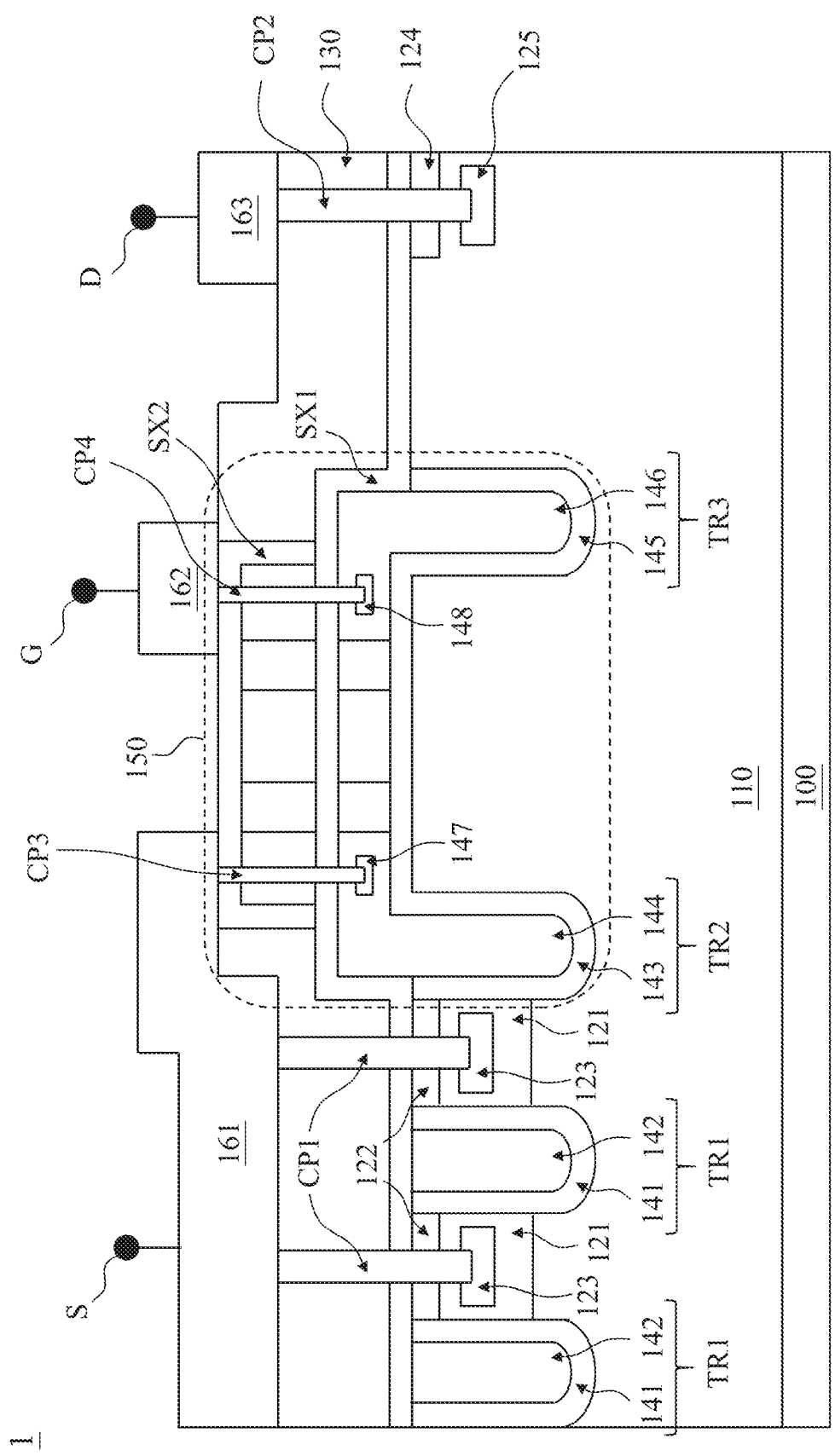
FIG. 2 is a schematic diagram of the example semiconductor power device according to embodiments of the present disclosure.

FIG. 2 is a schematic diagram of the semiconductor power device 1 according to some embodiments of the present disclosure. The semiconductor power device 1 includes a substrate 100, a lightly doped layer 110, and an interlayer dielectric layer 130. The lightly doped layer 110 is disposed on the substrate 100, and the interlayer dielectric layer 130 is disposed on the lightly doped layer 110.

In some embodiments, the substrate 100 may be disposed adjacent to the upper surface of a silicon wafer or a substrate of other semiconductor materials. In some embodiments, the substrate 100 is a portion of a silicon wafer. The material of the substrate 100 may include single crystal silicon material, epitaxial silicon material, silicon carbide (SiC), germanium (Ge), silicon germanium (SiGe), gallium nitride (GaN), gallium arsenide (GaAs), gallium arsenide phosphide (GaAsP) or other semiconductor materials. In some embodiments, the doping concentration of the substrate 100 may be greater than the doping concentration of the lightly doped region 110.

In some embodiments, the lightly doped layer 110 may include, for example, single crystal silicon material, epitaxial silicon material, silicon carbide (SiC), germanium (Ge), silicon germanium (SiGe), gallium nitride (GaN), gallium arsenide (GaAs), gallium arsenide phosphide (GaAsP) or other semiconductor materials, which may be N-type or P-type. In some embodiments, the lightly doped layer 110 is an N-type (a first conductivity type) epitaxial material. For ease of illustration, the N-type is used for the lightly doped layer 110 and the power transistor 10 as an example, but the present disclosure is not limited thereto. Whether the lightly doped layer 110 is the N-type (the first conductivity type) or the P-type (a second conductivity type) may be adjusted according to the conductivity type of the power transistor 10.

The semiconductor power device 1 further includes a plurality of trench structures TR1, a trench structure TR2, a trench structure TR3 and an electrostatic discharge protection structure 150. The plurality of trench structures TR1, the trench structure TR2 and the trench structure TR3 are disposed in the lightly doped layer 110, and extend toward the substrate 100 without contacting the substrate 100. Each trench structure may have a sidewall and a bottom surface. In some embodiments, each trench structure may have a vertical sidewall and an arc-shaped bottom surface. The electrostatic discharge protection structure 150 is disposed in the interlayer dielectric layer 130.

Each trench structure TR1 includes a polysilicon structure 142 and an oxide layer 141 surrounding the polysilicon structure 142. The trench structure TR2 includes a polysilicon structure 144 and an oxide layer 143 surrounding the polysilicon structure 144. The trench structure TR3 includes a polysilicon structure 146 and an oxide layer 145 surrounding the polysilicon structure 146. In some embodiments, the plurality of trench structures TR1 may be part of the gate structure of the power transistor 10, where the oxide layers 141 in the trench structures TR1 are the gate oxide layers of the power transistor 10. In some embodiments, the trench structure TR2 and the trench structure TR3 may be part of the electrostatic discharge protection structure 150. While FIG. 2 shows two trench structures TR1 in the semiconductor power device 1, there may be more than two trench structures TR1.

The semiconductor power device 1 may further include a plurality of body doped regions 121, a plurality of source doped regions 122, a plurality of heavily doped regions 123, a drain doped region 124, a heavily doped region 125, a plurality of conductive plugs CP1, and a conductive plug CP2. The body doped regions 121, the source doped regions 122, the heavily doped regions 123, the drain doped region 124, and the heavily doped region 125 are arranged in the lightly doped layer 110. One of the body doped regions 121 may be located between two adjacent trench structures TR1, and adjoin the oxide layers 141 of the two adjacent trench structures TR1. Another body doped region 121 may be located between the trench structure TR2 and a trench structure TR1 adjacent to the trench structure TR2, and adjoin the oxide layer 141 of the trench structure TR1 and the oxide layer 143 of the trench structure TR2. One of the source doped regions 122 may be located between the two adjacent trench structures TR1 and on a corresponding body doped region 121. Another source doped region 122 may be located between the trench structure TR2 and the trench structure TR1 adjacent to the trench structure TR2, and on a corresponding body doped region 121. In some embodiments, the thickness of the source doped regions 122 may be less than the thickness of the body doped regions 121. The source doped regions 122 may adjoin the body doped regions 121, the oxide layers 141 and/or the oxide layer 143. The drain doped region 124 may be separated from the trench structures TR1, the trench structure TR2 and the trench structure TR3.

The plurality of heavily doped regions 123 may be respectively disposed in the plurality of body doped regions 121. In some embodiments, the heavily doped regions 123 may not adjoin the source doped regions 122. The heavily doped region 125 may be disposed in the lightly doped layer 110, below the drain doped region 124 and may not adjoin the drain doped region 124. The plurality of conductive plugs CP1 may extend through the interlayer dielectric layer 130, and further extend through the plurality of source doped regions 122, respectively, to extend into the heavily doped regions 123 in the plurality of body doped regions 121. The conductive plug CP2 may extend through the interlayer dielectric layer 130 and the drain doped region 124 to reach in the heavily doped region 125. The configuration of each conductive plug may vary according to process or electrical requirements. The materials of the conductive plugs may include gold (Au), silver (Ag), copper (Cu), platinum (Pt), palladium (Pd), tungsten (W), titanium (Ti), tantalum (Ta), molybdenum (Mo) or other metals or alloys. In some embodiments, the conductive plugs CP1 and the conductive plug CP2 may have approximately the same length. In some embodiments, the conductive plugs CP1 and the conductive plug CP2 may have a configuration that is wide at the top and narrow at the bottom.

The semiconductor power device 1 may also include metal wires 161, 162 and 163 disposed on the interlayer dielectric layer 130. The metal wire 161 may be electrically coupled to the source doped regions 122 through the conductive plugs CP1, and connected to the source electrode S through an interconnection structure (not shown). The metal wire 162 may be electrically coupled to the polysilicon structures 142 in the trench structures TR1, and connected to the gate electrode G through the interconnection structure. The metal wire 163 may be electrically coupled to the drain doped region 124 through the conductive plug CP2, and connected to the drain electrode D through the interconnection structure. The electrostatic discharge protection structure 150 may be coupled between the metal wire 161 and the metal wire 162. In other words, the electrostatic discharge protection structure 150 is coupled between the source electrode S and the gate electrode G.

In some embodiments, the width of the metal wire 161 may be greater than that of the metal wire 162 and the metal wire 163. The materials of the metal wire 161, the metal wire 162 and the metal wire 163 may include copper (Cu), gold (Au), silver (Ag), aluminum (Al), nickel (Ni), titanium (Ti), tungsten (W), tin (Sn) or other metals or alloys. In some embodiments, the metal wire 161, the metal wire 162 and the metal wire 163 may be metal layers (e.g., M1 layer) closest to the lightly doped layer 110.

Figures 3A, 3B:
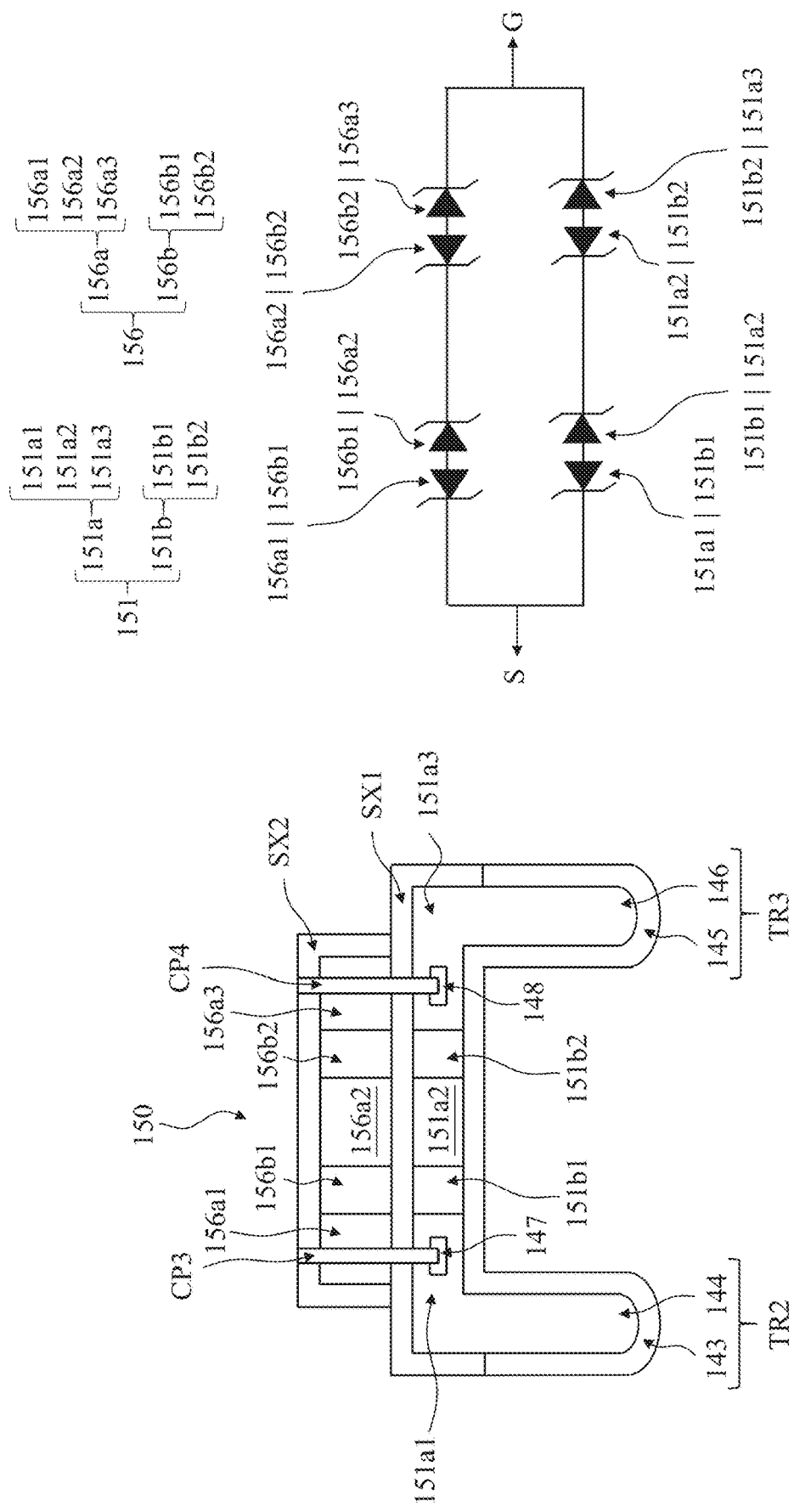
FIG. 3A is a schematic diagram of an example electrostatic discharge protection structure according to embodiments of the present disclosure.
FIG. 3B is a circuit diagram of the electrostatic discharge protection structure according to embodiments of the present disclosure.

For ease of description and keeping the diagrams simple, please refer to FIG. 3A and FIG. 3B for the symbols and details of the electrostatic discharge protection structure 150. FIG. 3A is a schematic diagram of the electrostatic discharge protection structure 150 in FIG. 2. FIG. 3B is a circuit diagram of the electrostatic discharge protection structure 150 in FIG. 2.

The electrostatic discharge protection structure 150 may include the trench structure TR2, the trench structure TR3, the diode string 151, the diode string 156, a spacing oxide layer SX1, a spacing oxide layer SX2, a conductive plug CP3, and a conductive plug CP4. The trench structure TR2 and the trench structure TR3 are disposed in the lightly doped layer 110. The diode string 151 is coupled between the trench structure TR2 and the trench structure TR3, and is disposed on the lightly doped layer 110. The diode string 156 is disposed on the diode string 151, and is electrically isolated from each other by the spacing oxide layer SX1. The spacing oxide layer SX2 is disposed on the diode string 156 and surrounds the diode string 156.

The conductive plug CP3 and the conductive plug CP4 are electrically coupled to the source electrode S and the gate electrode G through the metal wire 161 and the metal wire 162, respectively. The diode string 151 and the diode string 156 are connected in parallel between the conductive plug CP3 and the conductive plug CP4. In other words, the diode string 151 and the diode string 156 are connected in parallel between the source electrode S and the gate electrode G.

The trench structure TR2 includes the polysilicon structure 144 and the oxide layer 143 surrounding the polysilicon structure 144. The trench structure TR3 includes the polysilicon structure 146 and the oxide layer 145 surrounding the polysilicon structure 146. As shown in FIG. 2 and FIG. 3A, the oxide layer 143 and the oxide layer 145 extend along the lightly doped layer 110 and adjoin each other. In some embodiments, the oxide layer 143 and the oxide layer 145 may be a single continuous structure.

The diode string 151 includes a plurality of doped regions 151*a* and a plurality of doped regions 151*b* arranged alternately. The doped regions 151*a* and the doped regions 151*b* are of different conductivity types. The following description is based on the doped regions 151*a* being N-type and the doped regions 151*b* being P-type, and the number of doped regions as illustrated in FIG. 2 and FIG. 3A is used as an example, which is not intended to limit the present disclosure.

In some embodiments, the diode string 151 includes three N-type doped regions 151*a* and two P-type doped regions 151*b*. The doped regions 151*a* include a doped region 151*a*1, a doped region 151*a*2 and a doped region 151*a*3, and the doped regions 151*b* include a doped region 151*b*1 and a doped region 151*b*2. The doped region 151*a*1, the doped region 151*b*1, the doped region 151*a*2, the doped region 151*b*2 and the doped region 151*a*3 may be arranged in sequence, and the doped region 151*a*1 and the doped region 151*a*3 may serve as the first end and the second end of the diode string 151, respectively. The first end of the diode string 151 may be coupled to the source electrode S and adjoin the polysilicon structure 144 of the trench structure TR2. In some embodiments, the doped region 151*a*1 and the polysilicon structure 144 may be a single continuous structure. The second end of the diode string 151 may be coupled to the gate electrode G and adjoin the polysilicon structure 146 of the trench structure TR3. In some embodiments, the doped region 151*a*3 and the polysilicon structure 146 may be a single continuous structure.

In the diode string 151, two adjacent doped regions have different conductivity types, and thus PN junctions are formed on interfaces of adjacent doped regions. As shown in FIG. 3B, the diode string 151 includes four interfaces of adjacent doped regions, i.e., an interface between adjacent doped regions 151*a*1 and 151*b*1, an interface between adjacent doped regions 151*b*1 and 151*a*2, an interface between adjacent doped regions 151*a*2 and 151*b*2, and an interface between adjacent doped regions 151*b*2 and 151*a*3, and therefore, four PN junctions are formed. Because different conductivity types are alternately arranged, these four PN junctions form two back-to-back diodes connected in series.

In some embodiments, the diode string 151 and the diode string 156 have doped regions of the same number and type. In some embodiments, the diode string 151 and the diode string 156 have the same structure.

In some embodiments, the diode string 156 includes three N-type doped regions 156*a* and two P-type doped regions 156*b*. The doped regions 156*a* include a doped region 156*a*1, a doped region 156*al* and a doped region 156*a*3, and the doped regions 156*b* include a doped region 156*b*1 and a doped region 156*b*2. The doped region 156*a*1, the doped region 156*b*1, the doped region 156*a*2, the doped region 156*b*2 and the doped region 156*a*3 are arranged in sequence, and the doped region 156*al* and the doped region 156*a*3 serve as the first end and the second end of the diode string 156 respectively. The first end of the diode string 156 is coupled to the source electrode S, and the second end of the diode string 156 is coupled to the gate electrode G. The diode string 156 includes four interfaces of adjacent doped regions, thereby forming four PN junctions. The four PN junctions form two back-to-back diodes connected in series.

The spacing oxide layer SX1 is disposed on the diode string 151 and surrounds the diode string 151. As shown in FIG. 2, the spacing oxide layer SX1 may further extend on the surface of the lightly doped layer 110 and covers the source doped regions 122, the drain doped region 124 and the trench structures TR1. The conductive plugs CP1 and the conductive plug CP2 further extend through the spacing oxide layer SX1. The spacing oxide layer SX2 is disposed on the diode string 156 and surrounds the diode string 156. The spacing oxide layer SX2 may adjoin the spacing oxide layer SX1 along the side surface of the diode string 156. The diode string 151 and the diode string 156 may be separated from the interlayer dielectric layer 130 by the spacing oxide layer SX1 and the spacing oxide layer SX2.

The electrostatic discharge protection structure 150 may further include a heavily doped region 147 and a heavily doped region 148. The heavily doped region 147 may be disposed in the doped region 151*a*1, and the heavily doped region 148 may be disposed in the doped region 151*a*3. The conductive plug CP3 extends through the spacing oxide layer SX2, the doped region 156*al* and the spacing oxide layer SX1, to extend into the heavily doped region 147 in the doped region 151*a*1, and couples the source electrode S to the doped region 151*al* and the doped region 156*a*1. The conductive plug CP4 extends through the spacing oxide layer SX2, the doped region 156*a*3 and the spacing oxide layer SX1 to extend into the heavily doped region 148 in the doped region 151*a*3, and couples the gate electrode G to the doped region 151*a*3 and the doped region 156*a*3.

An end of the conductive plug CP3 is in contact with the heavily doped region 147. The width of the heavily doped region 147 may be greater than the width of the end of the conductive plug CP3, and thus, the heavily doped region 147 may surround the end of the conductive plug CP3. An end of the conductive plug CP4 is in contact with the heavily doped region 148. The width of the heavily doped region 148 may be greater than the width of the end of the conductive plug CP4, and thus, the heavily doped region 148 may surround the end of the conductive plug CP4.

For certain electrostatic discharge protection structures in the prior art, with a preset fixed withstand voltage, the current with which the electrostatic discharge protection structures can be turned on is limited by the usable circuit area. Further, the multiple diodes in an electrostatic discharge protection structure are generally arranged on the same plane. In comparison, embodiments of the present disclosure make better use of the three-dimensional space for providing the multiple diodes in the electrostatic discharge protection structure 150. The diodes are arranged in stacks or layers within the available circuit area, and the spacing oxide layer SX1 is used to separate the diode strings in different layers. Therefore, for the same circuit area, the electrostatic discharge protection structure 150 provided in the embodiments of the present disclosure has diodes of a higher density. A parallel arrangement is further used to increase the width of the equivalent current channel, and reduce the resistance value, and thus the current value that can turn on the electrostatic discharge protection structure 150 is increased.

Figure 4:
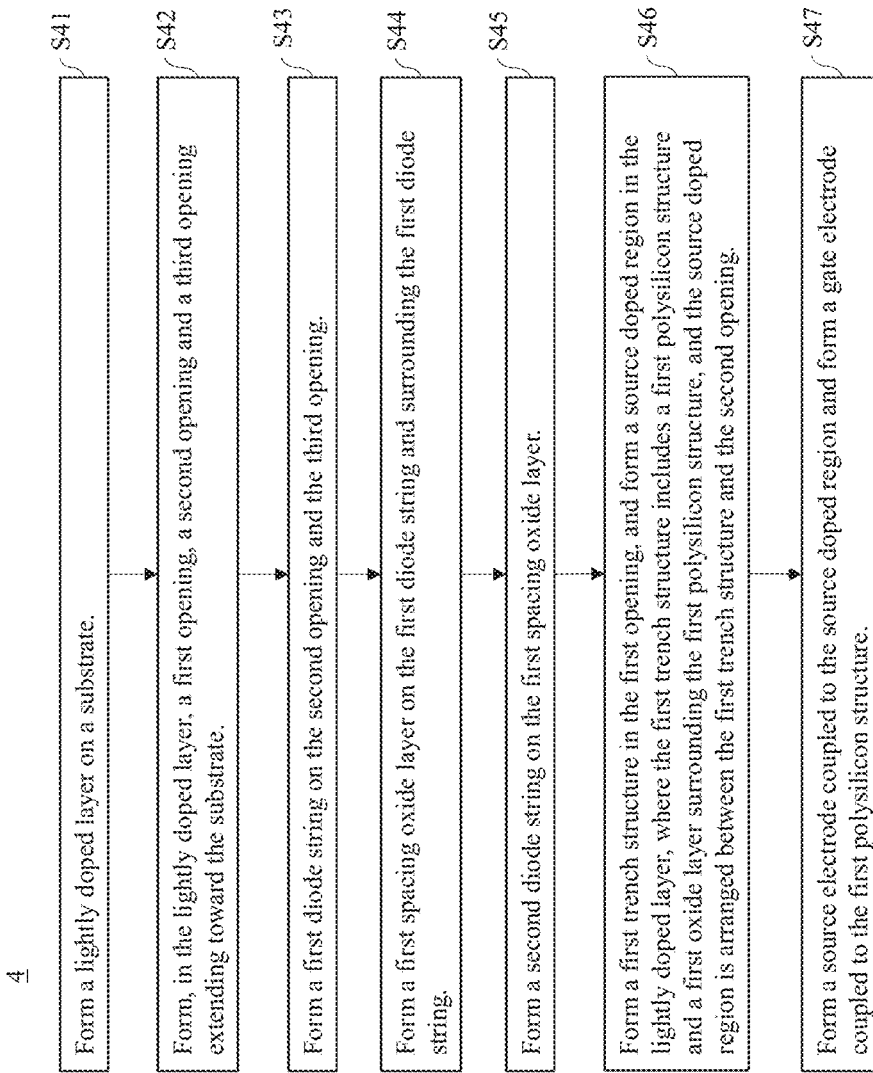
FIG. 4 is a flowchart of a manufacturing method for a semiconductor power device according to embodiments of the present disclosure.

FIG. 4 is a flowchart of a manufacturing method 4 of a semiconductor power device according to some embodiments of the present disclosure. The manufacturing method 4 includes step S41, step S42, step S43, step S44, step S45, step S46 and step S47. FIG. 5 to FIG. 34 are schematic diagrams of a manufacturing process of the semiconductor power device according to some embodiments of the present disclosure. For ease of understanding, the manufacturing method 4 is illustrated with reference to FIG. 5 to FIG. 34. The manufacturing method 4 may be indicative of operations that are used for manufacturing the semiconductor power device 1 as illustrated with respect to FIG. 1, and FIG. 5 to FIG. 34 show the semiconductor power device 1 in various stages of the manufacturing process. The manufacturing method 4 may also be applied to manufacture other semiconductor devices having the electrostatic discharge protection structure 150, without departing from the spirit and principle of the present disclosure, for example, the semiconductor device in FIG. 35 and FIG. 36.

Figure 5:
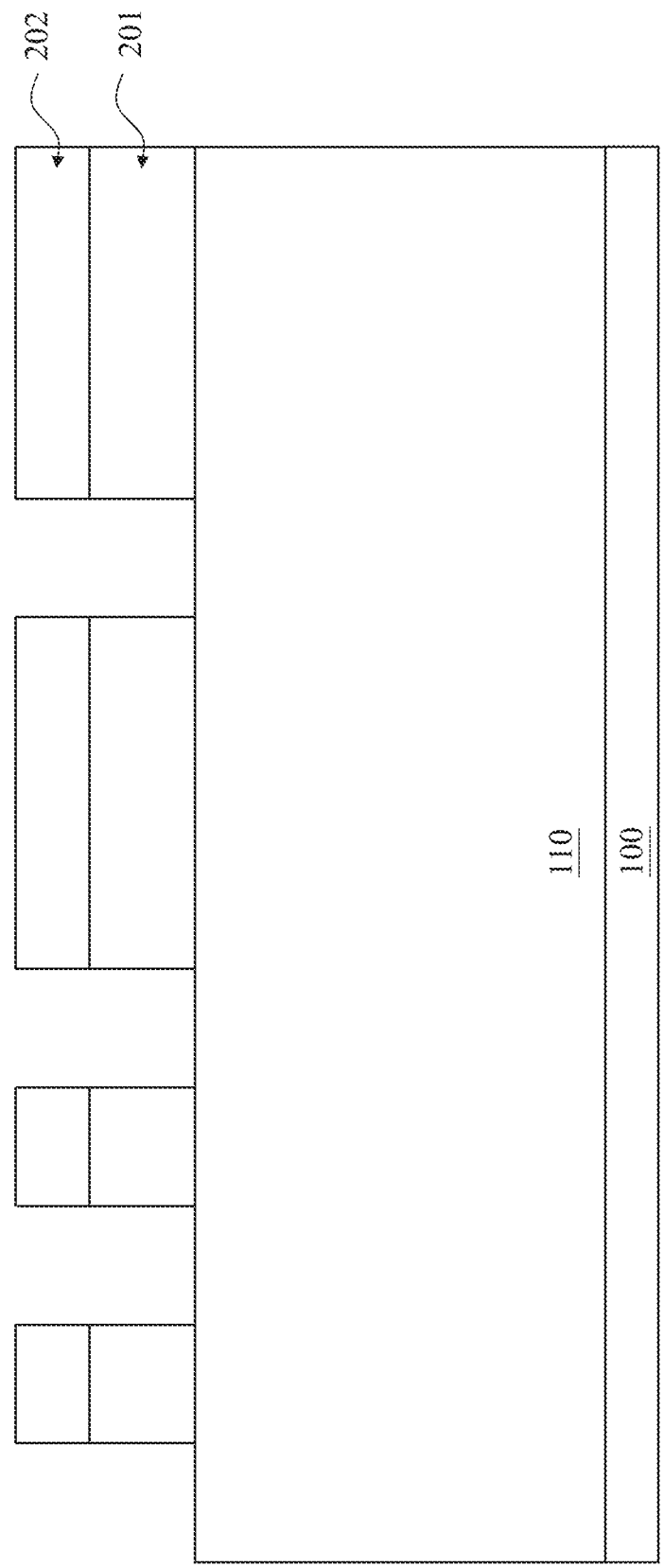
FIG. 5 to FIG. 34 are schematic diagrams illustrating an example semiconductor power device in manufacture according to embodiments of the present disclosure.

Referring to FIG. 5, in step S41, a lightly doped layer 110 is formed on a substrate 100. Next, an oxidized hard mask 201 may be formed on the lightly doped layer 110 using, e.g., a thermal oxidation process, and a patterned photoresist layer 202 may be formed on the oxidized hard mask 201. The oxidized hard mask 201 may be etched according to the patterned photoresist layer 202 to transfer the pattern on the photoresist layer 202 to the oxidized hard mask 201. In some embodiments, after the pattern on the photoresist layer 202 is transferred to the oxidized hard mask 201, the photoresist layer 202 is removed.

Figure 6:
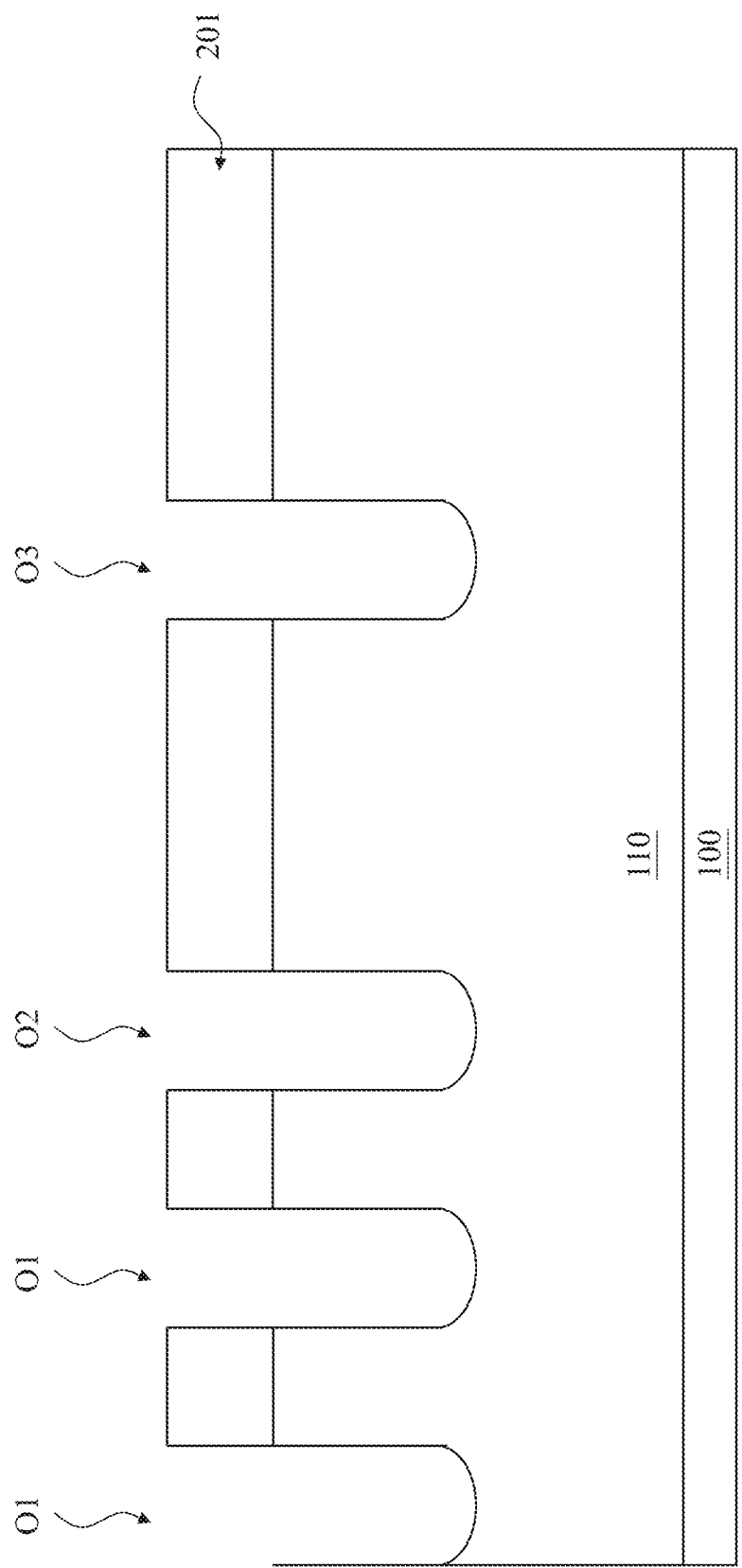

Referring to FIG. 6, in step S42, a plurality of openings O1, an opening O2 and an opening O3 extending toward the substrate 100 are formed in the lightly doped layer 110. The positions of the plurality of openings O1, the opening O2 and the opening O3 correspond to the pattern of the oxidized hard mask 201.

Figure 7:
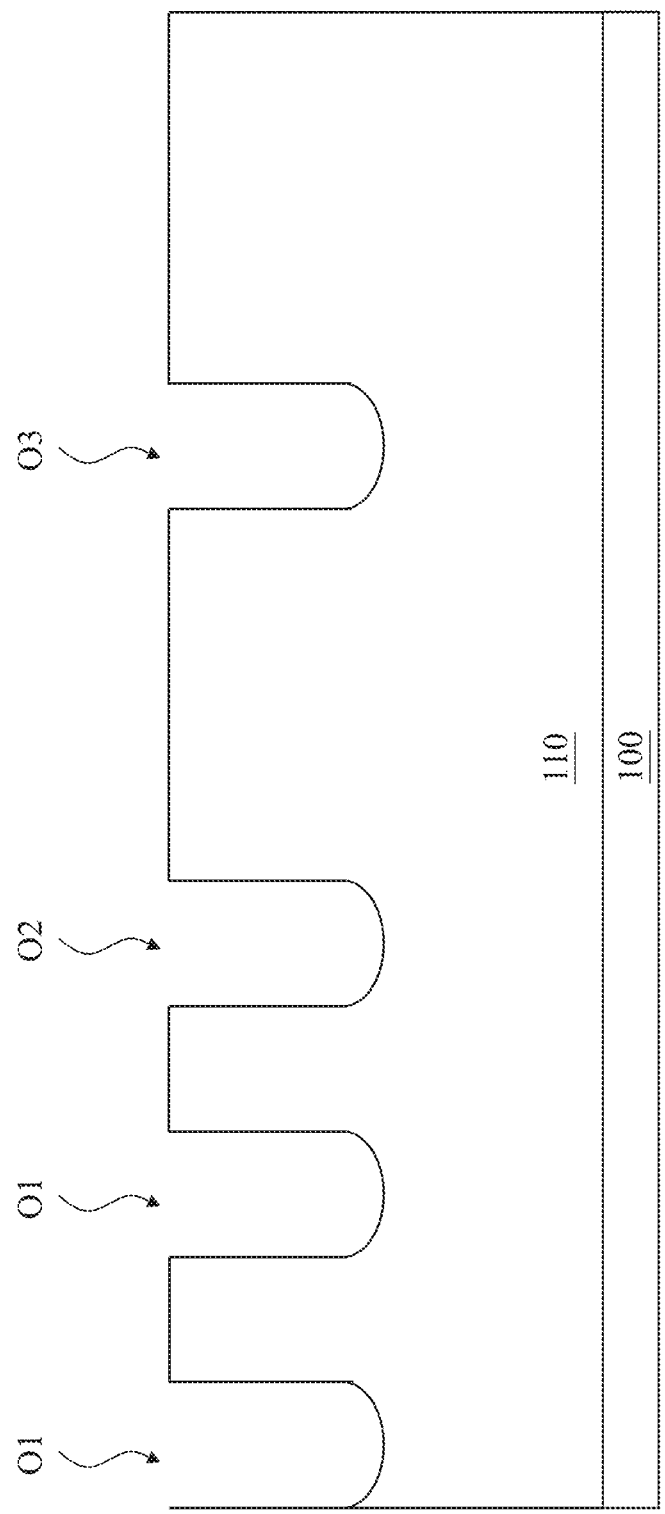

Referring to FIG. 7, after the plurality of openings O1, the opening O2 and the opening O3 are formed, the oxidized hard mask 201 is removed.

In some embodiments, after the oxide hard mask 201 is removed, a sacrificial oxide layer may be formed on the exposed surface of the lightly doped layer 110 using an oxidation process, and the sacrificial oxide layer is then removed. The oxidation process can be performed by adding oxygen and heating to form an oxide, such as silicon dioxide, on the surface of the lightly doped layer 110. In some embodiments, the formation and removal of the sacrificial oxide layer is to optimize the surface of the lightly doped layer 110.

Figure 8:
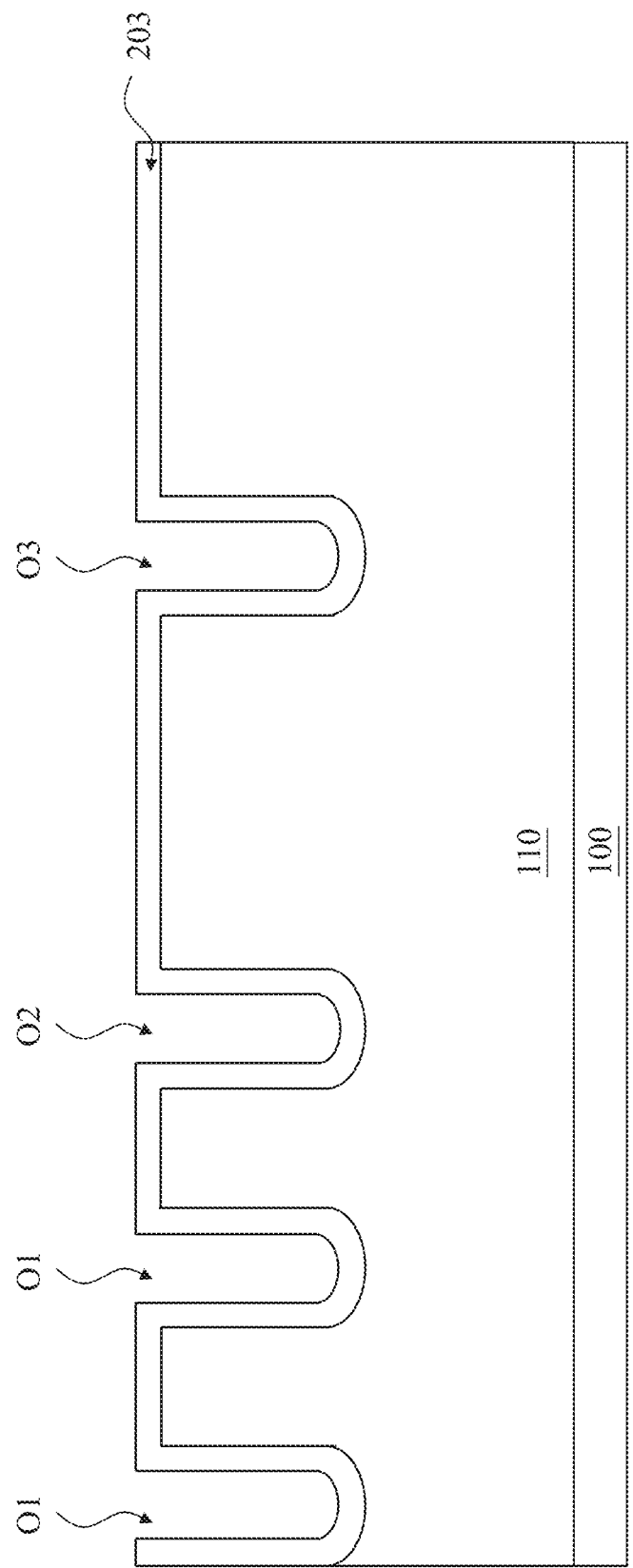
Figure 9:
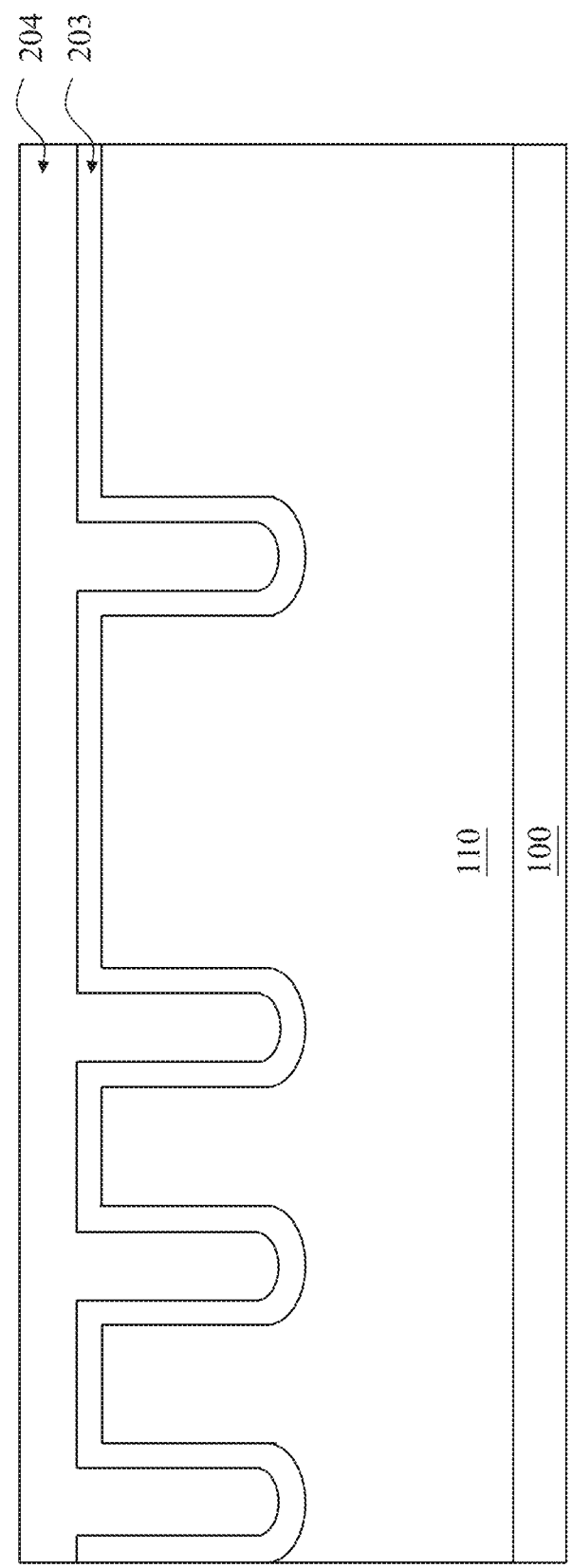
Figure 10:
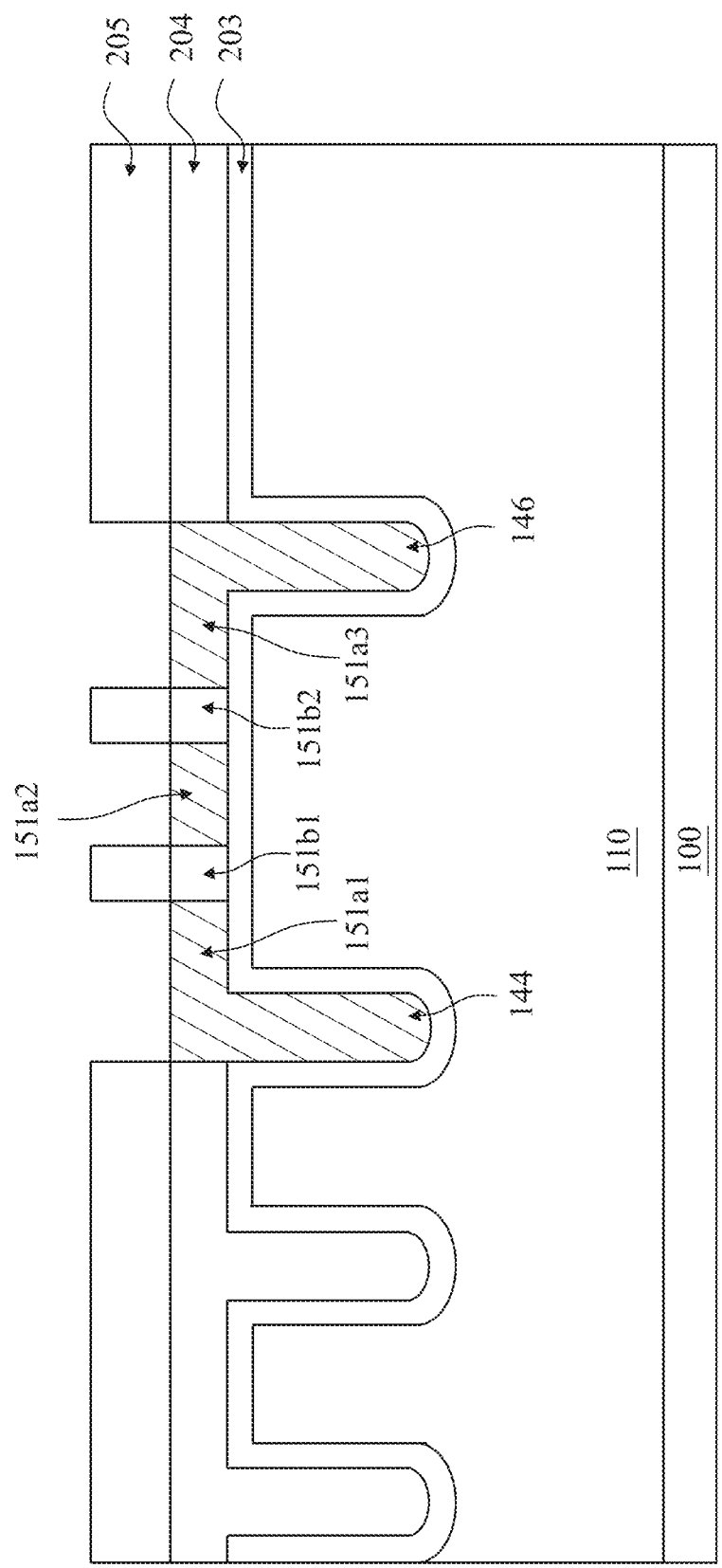

Referring to FIG. 8 to FIG. 10, in step S43, a diode string 151 is formed on the opening O2 and the opening O3. As shown in FIG. 8, a gate oxide layer 203 is formed on the surface of the lightly doped layer 110. The gate oxide layer 203 is also formed on the surface of the openings O1, the opening O2, and the opening O3. In some embodiments, the thickness of the gate oxide layer 203 may be substantially uniform.

As shown in FIG. 9, polysilicon may be formed on the gate oxide layer 203 and fills the openings O1, the opening O2, and the opening O3. In some embodiments, a planarization process may further be performed after the polysilicon is formed to make the polysilicon have a smooth surface. Next, an ion implantation process may be performed on the polysilicon to form a polysilicon 204 of the second conductive type (P-type). In some embodiments, a thermal annealing process may be performed on the polysilicon 204 to eliminate damage to the polysilicon 204 caused by the ion implantation process.

As shown in FIG. 10, a photoresist layer 205 may be formed on the polysilicon 204, and the photoresist layer 205 defines positions of doped regions 151a1, 151a2 and 151a3 in the diode string 151. An opening of the photoresist layer 205 exposes a portion of the surface of the polysilicon 204. The photoresist layer 205 may then be used as a shield to perform an ion implantation process on the exposed portion of the polysilicon 204, so that the exposed portion of the polysilicon 204 forms the doped regions 151a1, 151a2 and 151a3. In addition, due to the ion implantation process performed, the doping concentration of the polysilicon 204 in the opening O2 and the opening O3 is changed, which causes the polysilicon 204 in the opening O2 to become a polysilicon structure 144, and the polysilicon 204 in the opening O3 to become a polysilicon structure 146. After the ion implantation process is performed, the photoresist layer 205 is removed. Since the portion of the polysilicon 204 is formed into the doped region 151a1, the doped region 151a2 and the doped region 151a3, the polysilicon 204 between the doped region 151a1 and the doped region 151a3 is the doped region 151b1 and the doped region 151b2. Therefore, the doped region 151a and the doped region 151b of the diode string 151 are formed in the step of FIG. 10. The conductivity type of the doped region 151a1, the doped region 151a2, the doped region 151a3, the polysilicon structure 144 and the polysilicon structure 146 formed after the ion implantation process is different from the conductivity type of the polysilicon 204. In other words, the conductivity type of the doped region 151a1, the doped region 151a2, the doped region 151a3, the polysilicon structure 144 and the polysilicon structure 146 is different from the conductivity type of the doped region 151b1 and the doped region 151b2.

Figure 11:
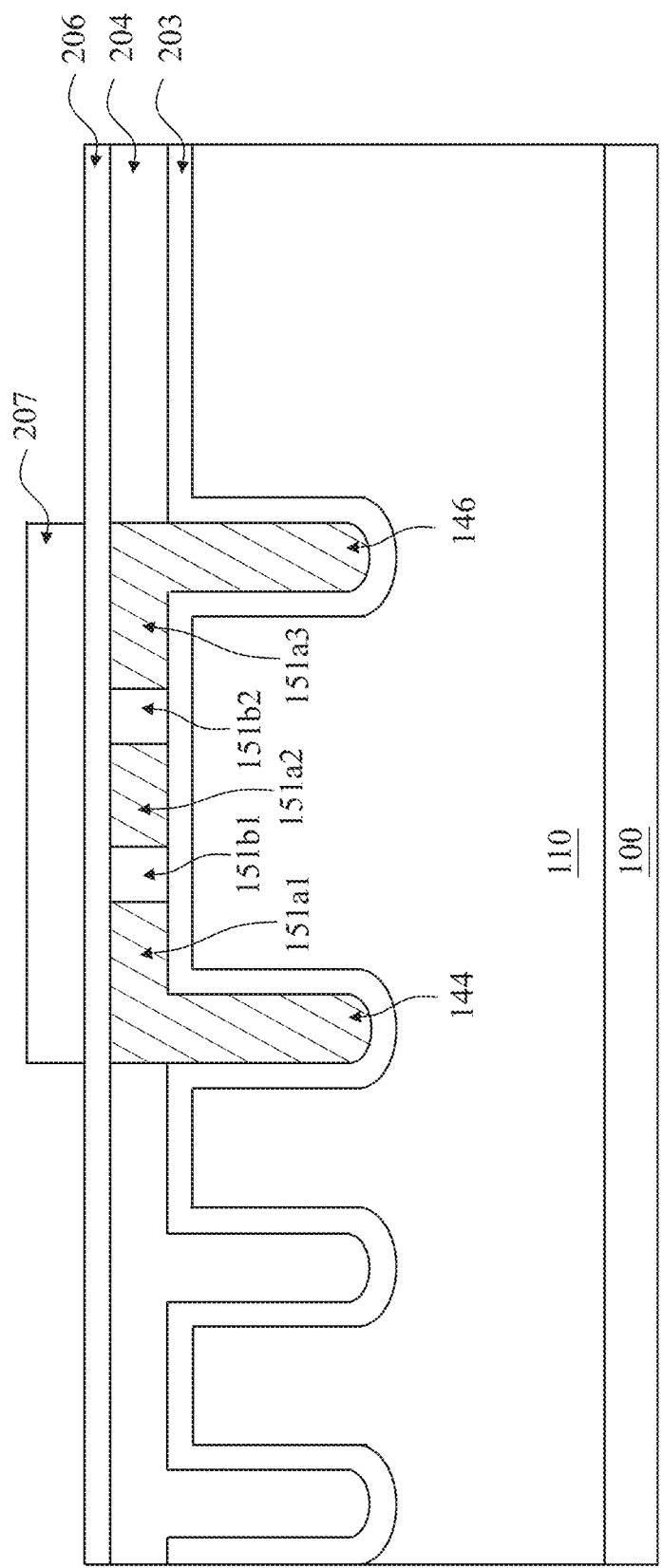

Referring to FIG. 11, a hard mask layer 206 may be formed on the polysilicon 204, the doped region 151a and the doped region 151b, and a photoresist layer 207 may be formed on the hard mask layer 206. The photoresist layer 207 may be used to define the position of the electrostatic discharge protection structure 150. More specifically, the photoresist layer 207 covers the position of the electrostatic discharge protection structure 150.

Figure 12:
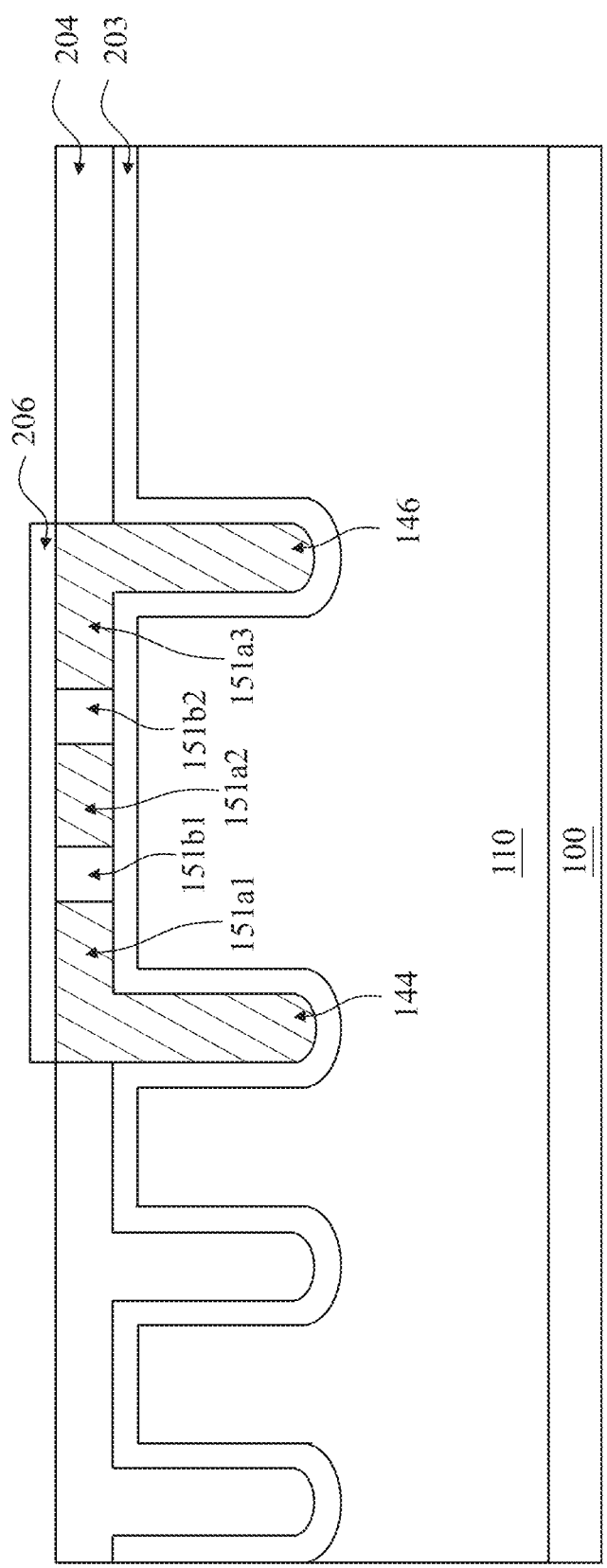

Referring to FIG. 12, an etching process may be performed on the hard mask layer 206 based on the photoresist layer 207, so that the portion of the hard mask layer 206 not covered by the photoresist layer 207 is removed. The photoresist layer 207 is then removed.

Figure 13:
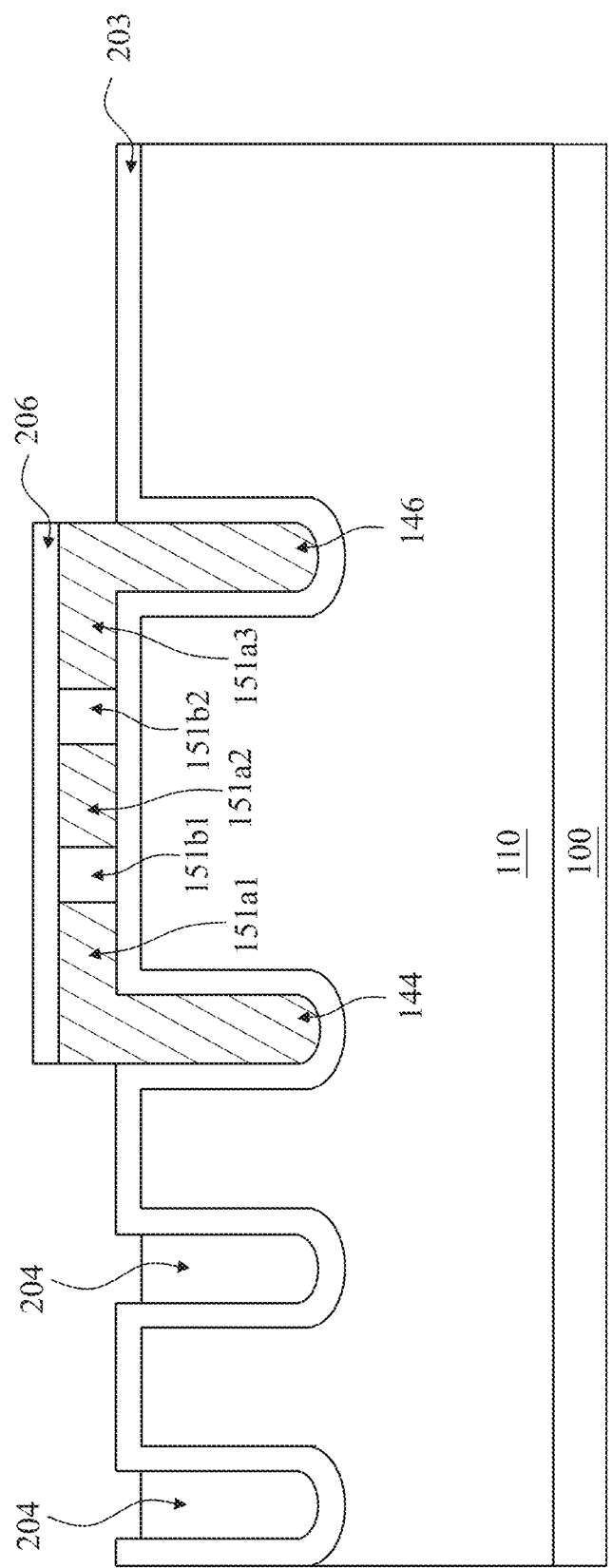

Referring to FIG. 13, based on the hard mask layer 206, an etching process may be performed on the polysilicon 204 to remove the polysilicon 204 not covered by the hard mask layer 206. In some embodiments, the polysilicon 204 filled in the openings O1 may not be removed. When the etching process is completed, the top surface of the remaining polysilicon 204 may substantially be coplanar with the top surface of the lightly doped layer 110.

Figure 14:
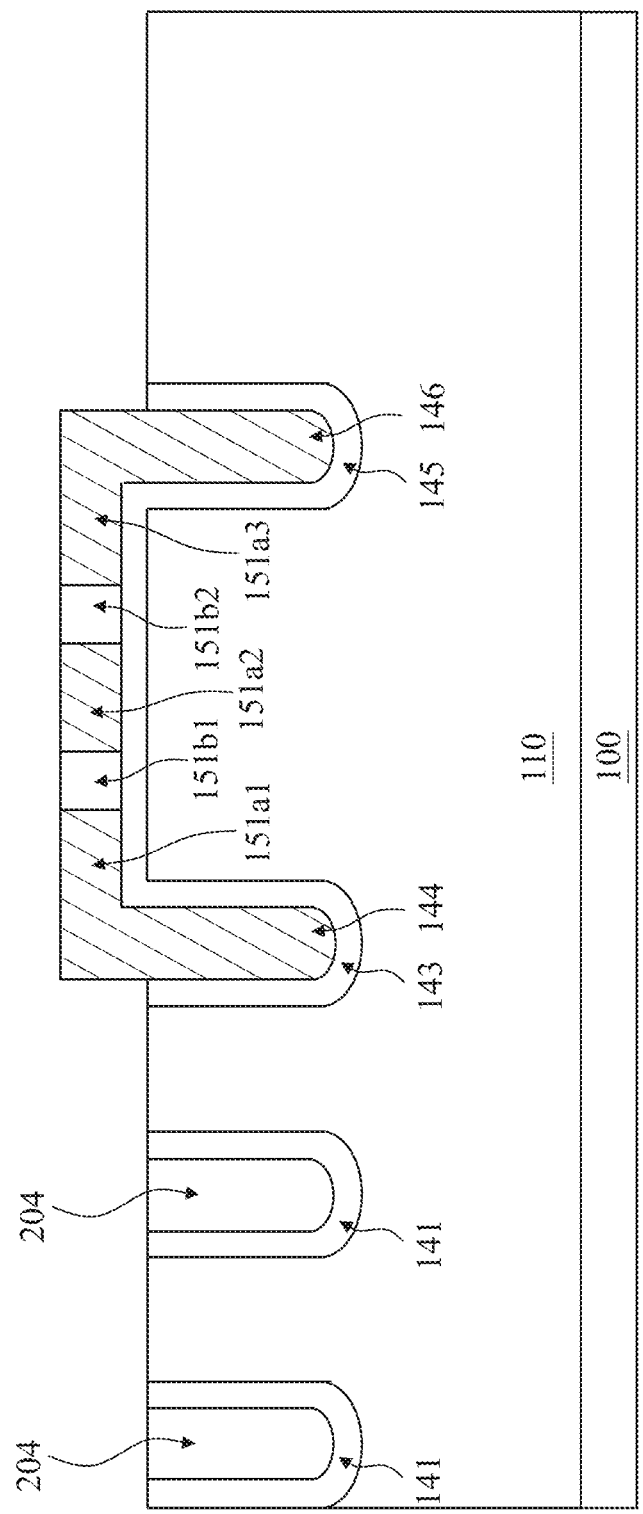

Referring to FIG. 14, the hard mask layer 206 covering the diode string 151 and the gate oxide layer 203 covering the lightly doped layer 110 are removed. The original gate oxide layer 203 becomes a plurality of discontinuous parts. The gate oxide layer 203 in the openings O1 becomes the oxide layers 141, and the gate oxide layer 203 in the opening O2 and the opening O3 becomes the oxide layer 143 and the oxide layer 145, respectively.

Figure 15:
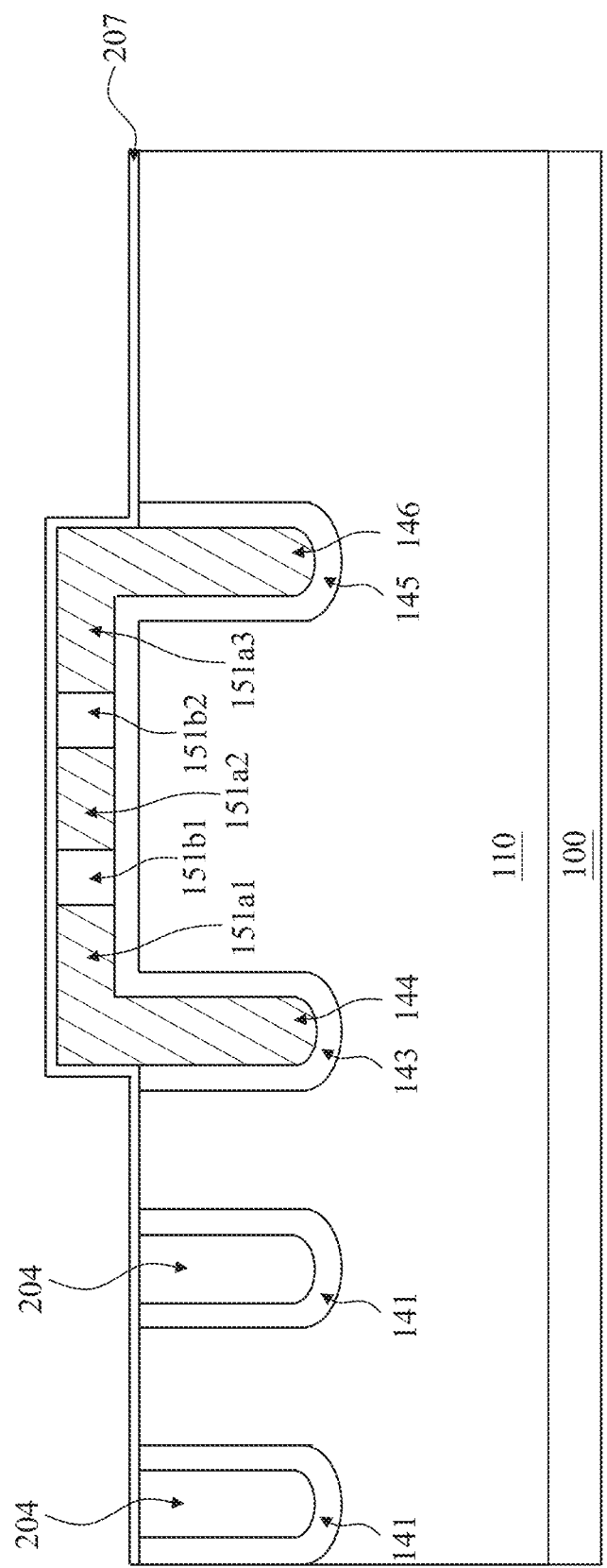

Referring to FIG. 15, an oxide layer 207 may be formed on the lightly doped layer 110. The oxide layer 207 may further cover the diode string 151, the oxide layers 141, the polysilicon 204, a portion of the oxide layer 143, and a portion of the oxide layer 145. In some embodiments, the oxide layer 207 may be formed by a thermal oxidation process.

Figure 16:
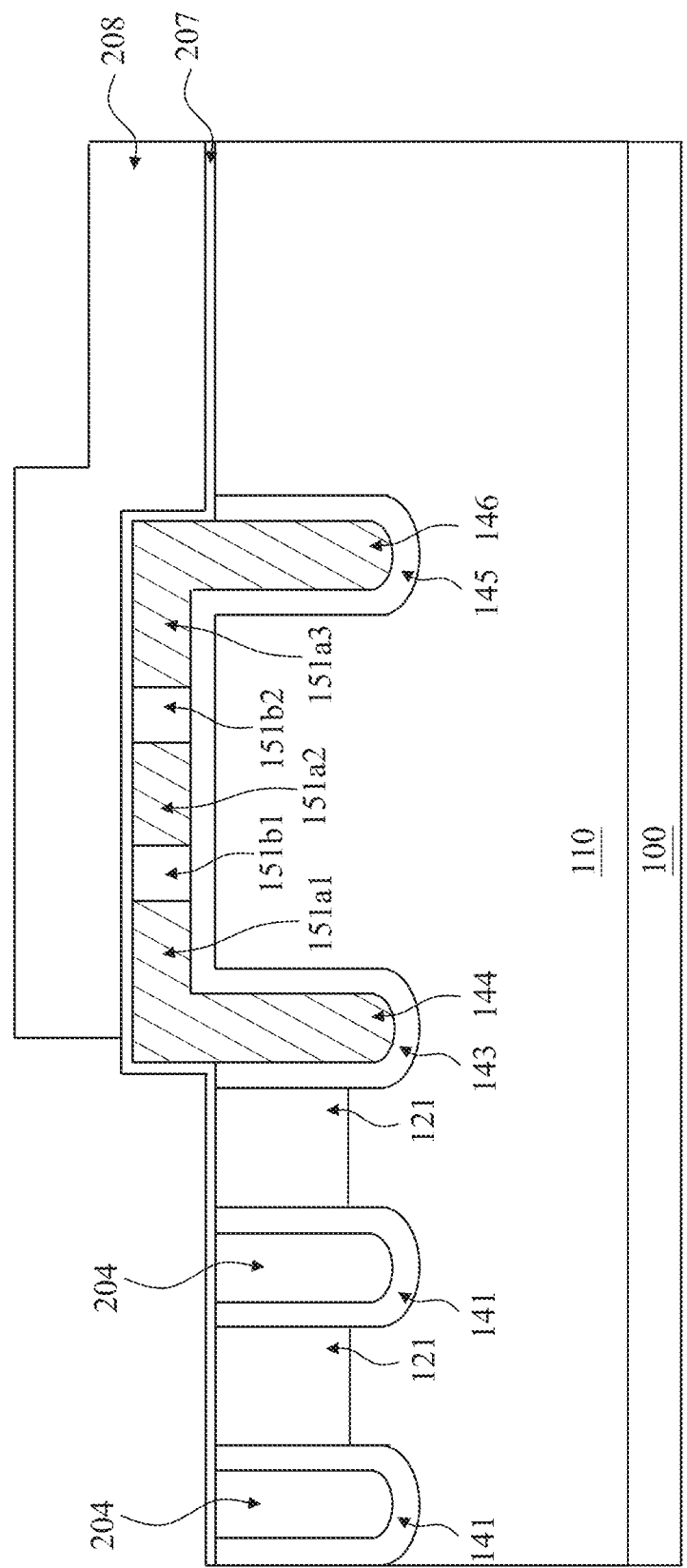

Referring to FIG. 16, a photoresist layer 208 may be formed on the oxide layer 207. The photoresist layer 208 may be used to define the position of body doped regions 121. Next, an ion implantation process may be performed on the lightly doped layer 110 based on the photoresist layer 208, such that a portion of the lightly doped layer 110 becomes the body doped regions 121.

Figure 17:
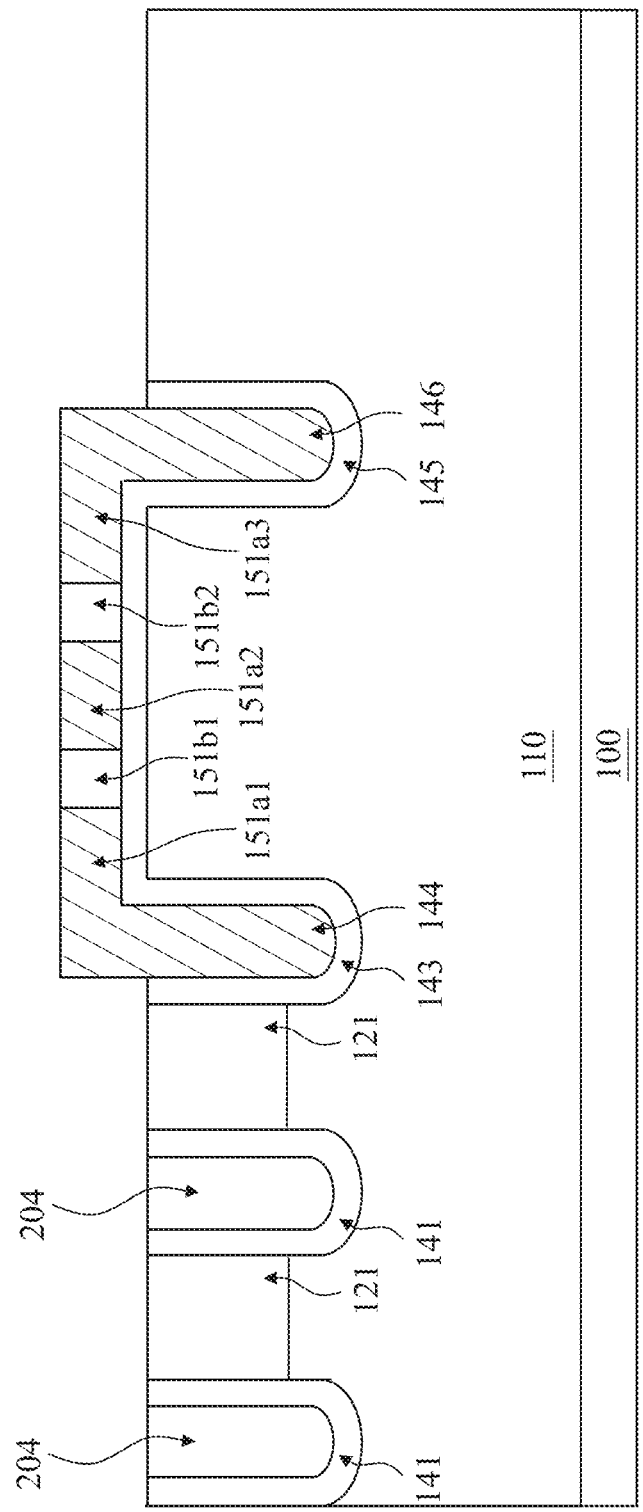

Referring to FIG. 17, after the body doped regions 121 are formed, the photoresist layer 208 and the oxide layer 207 are removed.

Figure 18:
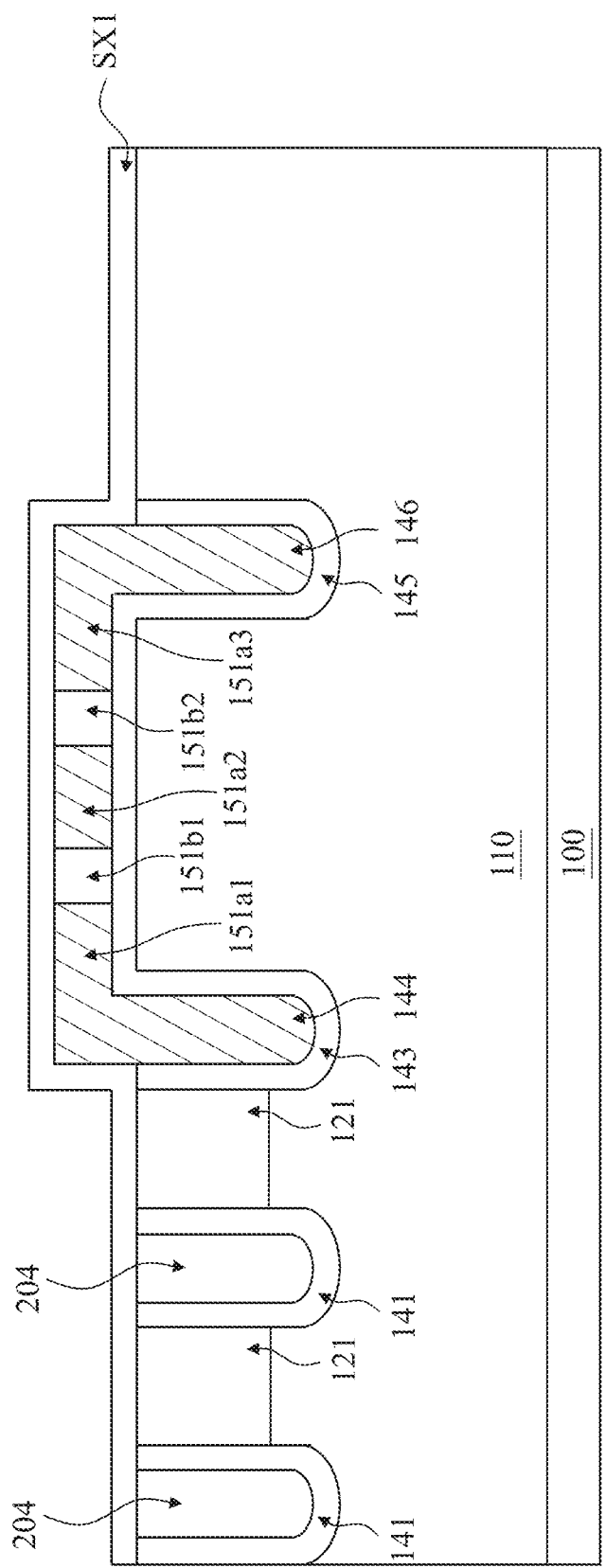

Referring to FIG. 18, in step S44, a spacing oxide layer SX1 is formed on the diode string 151 and surrounds the diode string 151. The spacing oxide layer SX1 is also formed on the lightly doped layer 110, the polysilicon 204, the oxide layers 141, the oxide layer 143, and the oxide layer 145. After the spacing oxide layer SX1 is formed, the diode string 151 is surrounded by the spacing oxide layer SX1, the oxide layer 143, and the oxide layer 145. In some embodiments, the thickness of the spacing oxide layer SX1 may be greater than the thickness of the oxide layer 207. In some embodiments, the spacing oxide layer SX1 may be formed by a thin film process, such as a chemical vapor deposition (CVD) process. In some embodiments, the isolation between the diode string 151 and adjacent components can be determined by the thickness of the spacing oxide layer SX1, and the spacing oxide layer SX1 formed by CVD can precisely control the deposition thickness.

Figure 19:
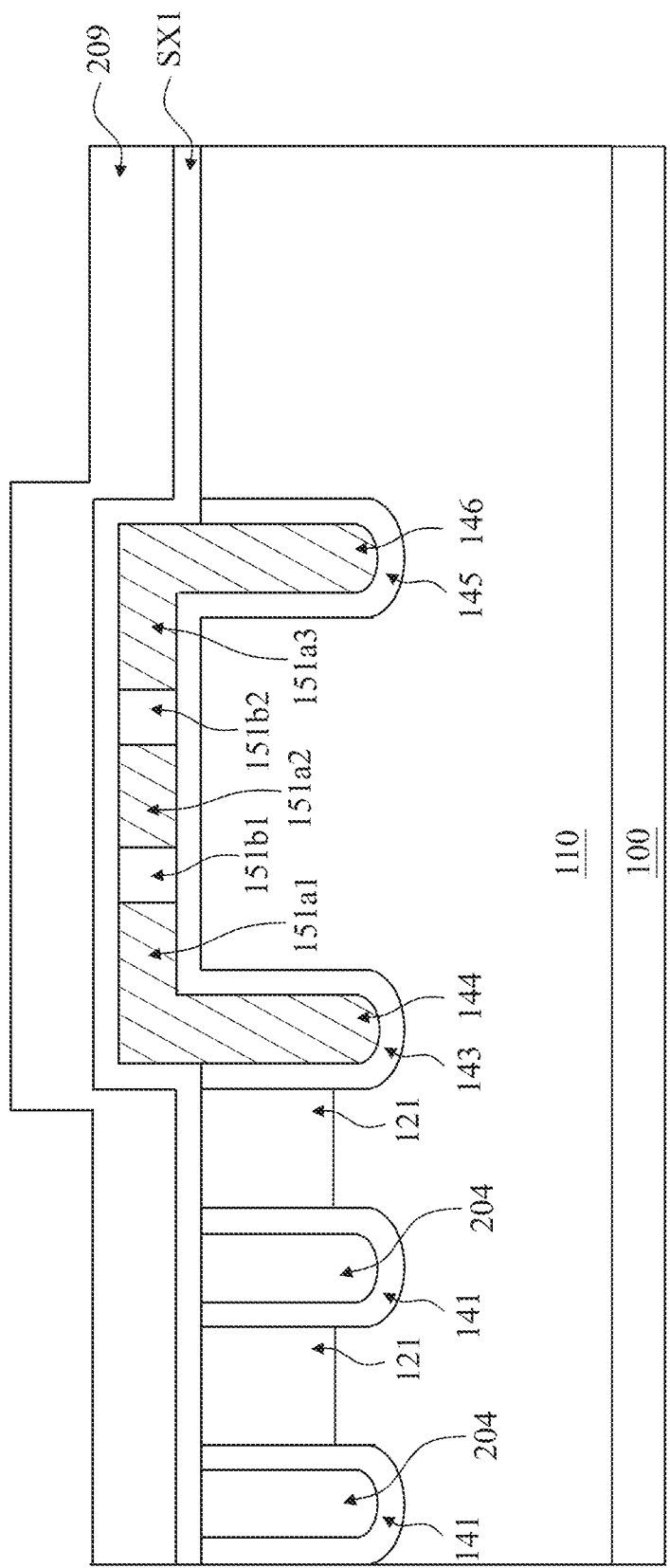
Figure 20:
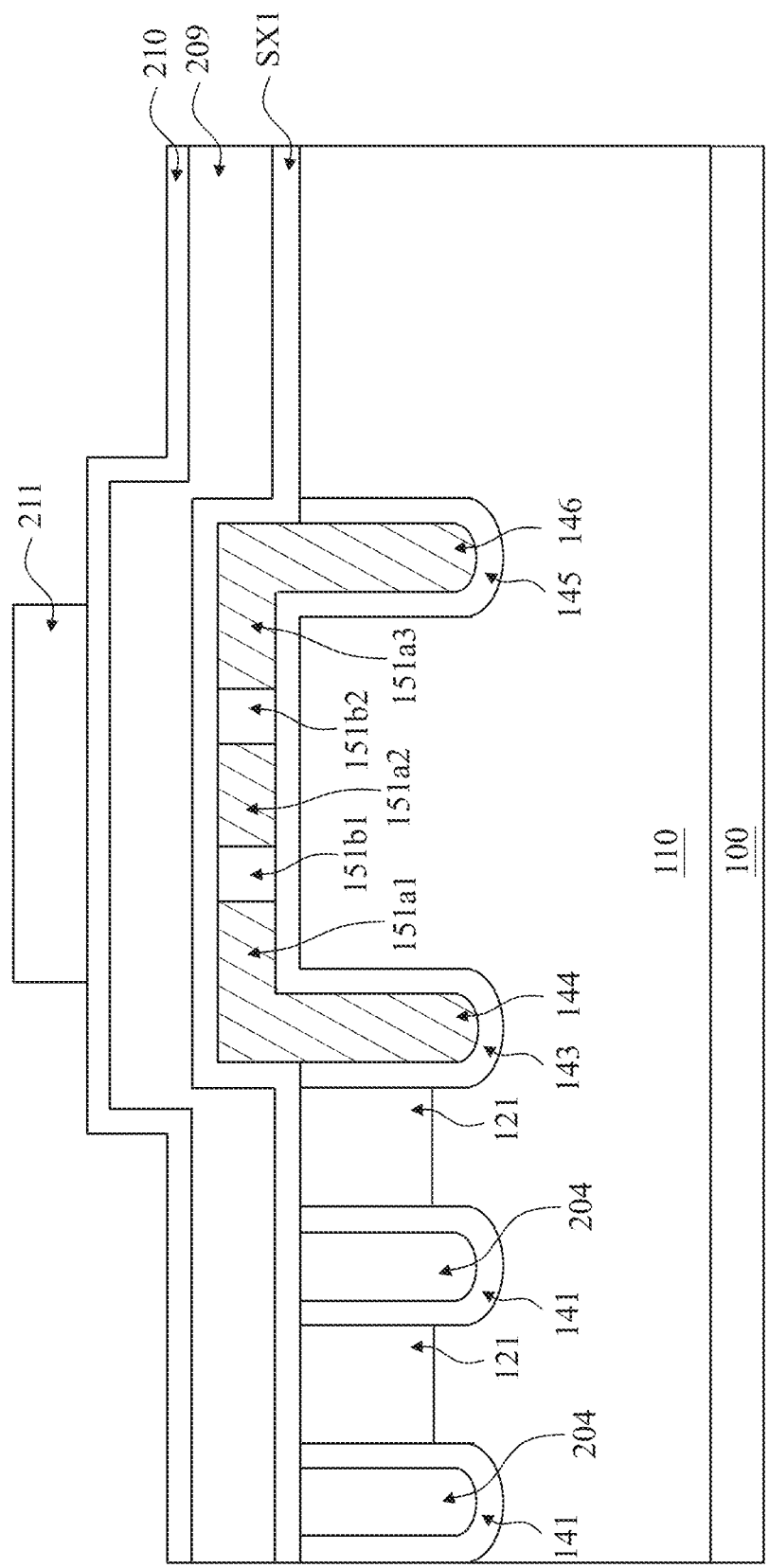
Figure 21:
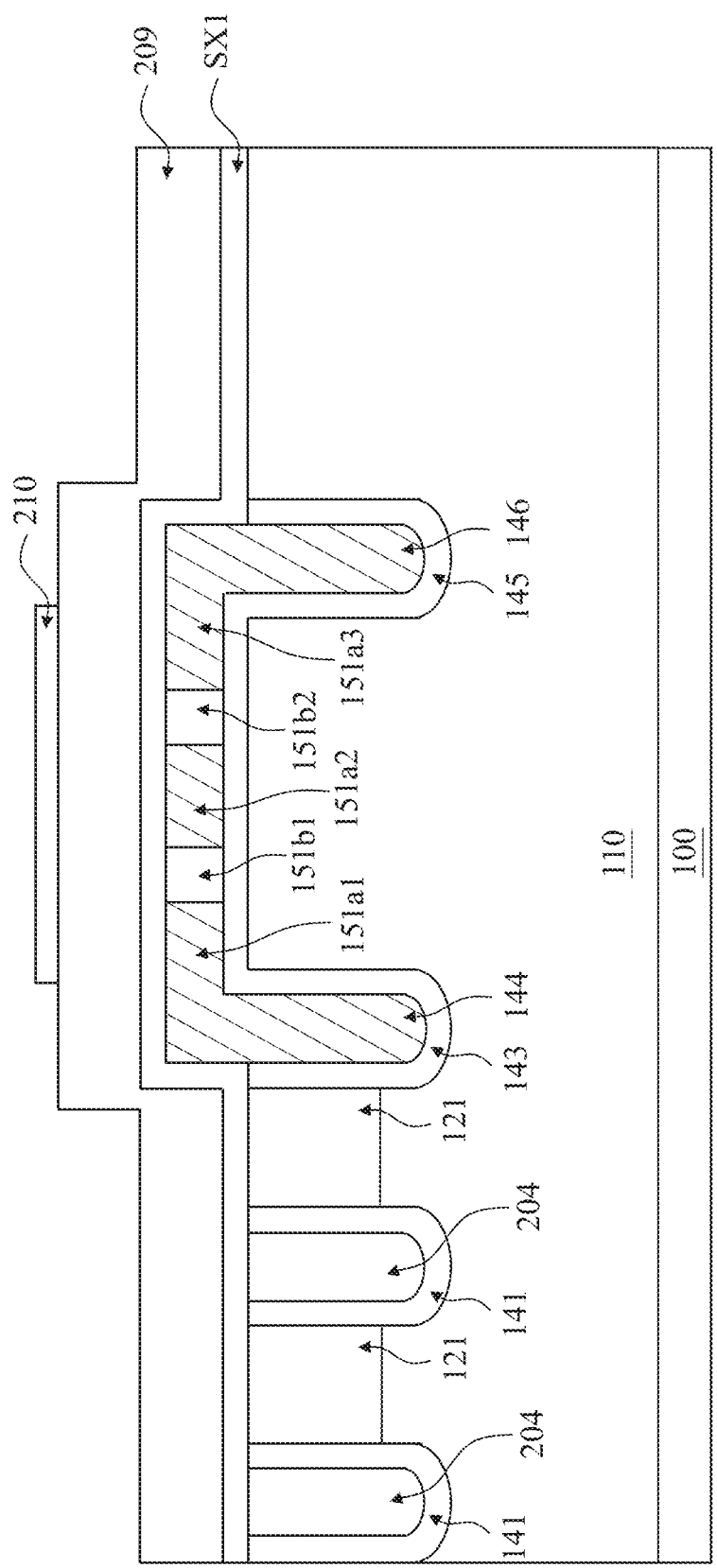
Figure 22:
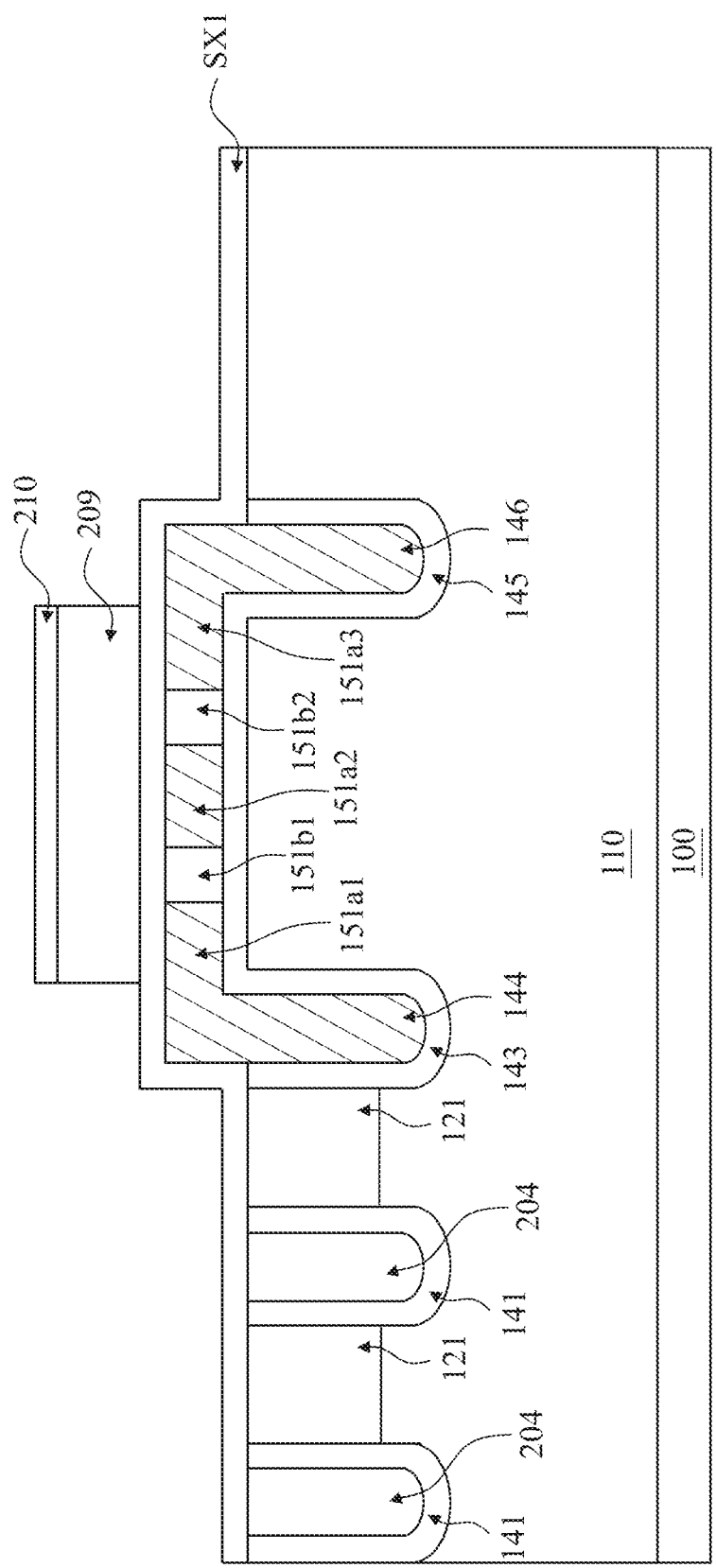

Referring to FIG. 19 to FIG. 24, in step S45, a diode string 156 is formed on the spacing oxide layer SX1. As shown in FIG. 19, polysilicon 209 of the second conductive type (P-type) is formed on the spacing oxide layer SX1. In some embodiments, the polysilicon 209 may be formed conformally on the spacing oxide layer SX1. As shown in FIG. 20, a hard mask layer 210 may be formed on the polysilicon 209, and a photoresist layer 211 may be formed on the hard mask layer 210. The photoresist layer 211 is used to define the position of the diode string 156. As shown in FIG. 21, an etching process is performed on the hard mask layer 210 based on the photoresist layer 211, such that the hard mask layer 210 located below the photoresist layer 211 is retained, and the other parts of the hard mask layer 210 are removed. After the etching process is completed, the photoresist layer 211 is removed. As shown in FIG. 22, another etching process may be performed on the polysilicon 209 according to the remaining hard mask layer 210, such that the polysilicon 209 not covered by the hard mask layer 210 is removed, and the polysilicon 209 under the hard mask layer 210 is retained. After the etching process on the polysilicon 209 is completed, the hard mask layer 210 is removed.

Figure 23:
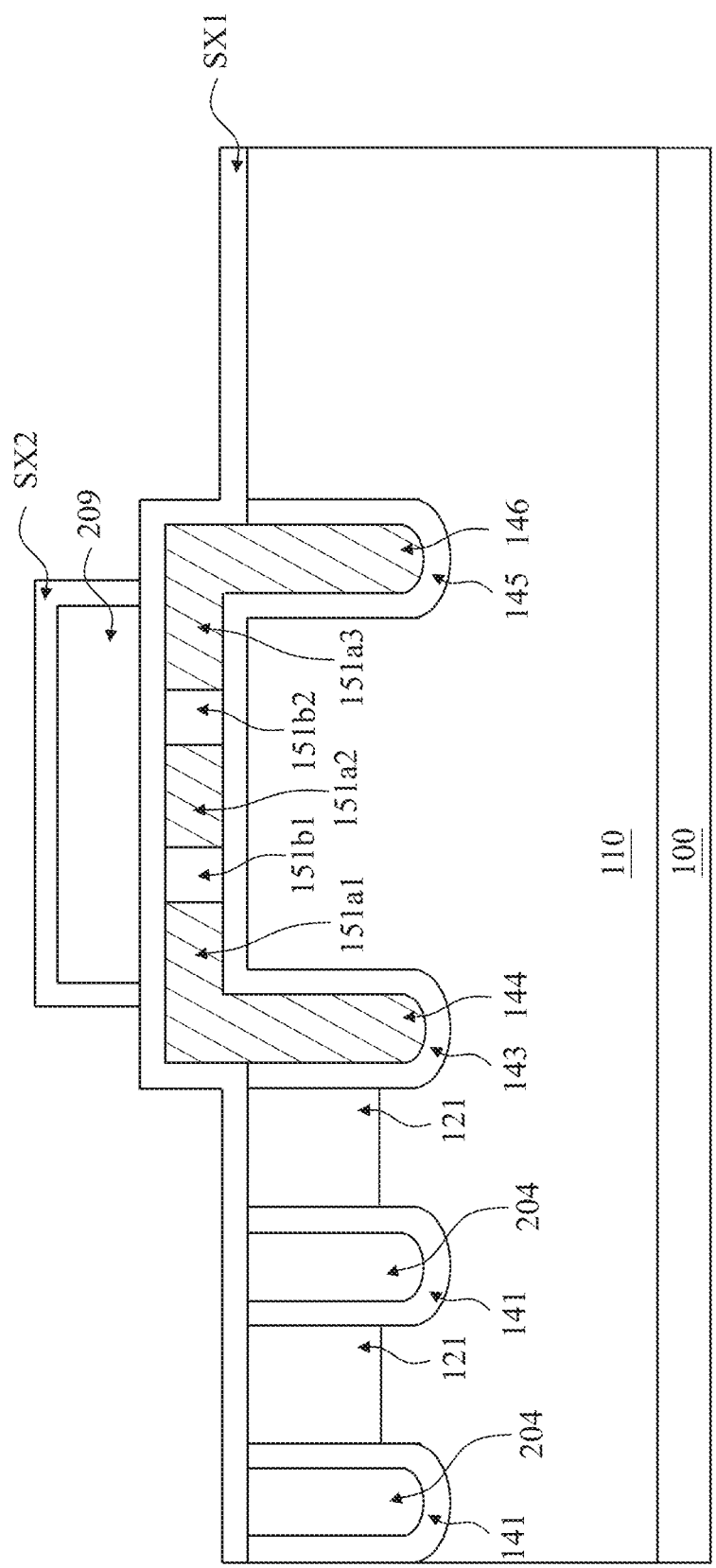

As shown in FIG. 23, a spacing oxide layer SX2 is formed on the polysilicon 209 and surrounds the polysilicon 209. The spacing oxide layer SX2 extends along the sidewall of the polysilicon 209 and adjoins the spacing oxide layer SX1.

Figure 24:
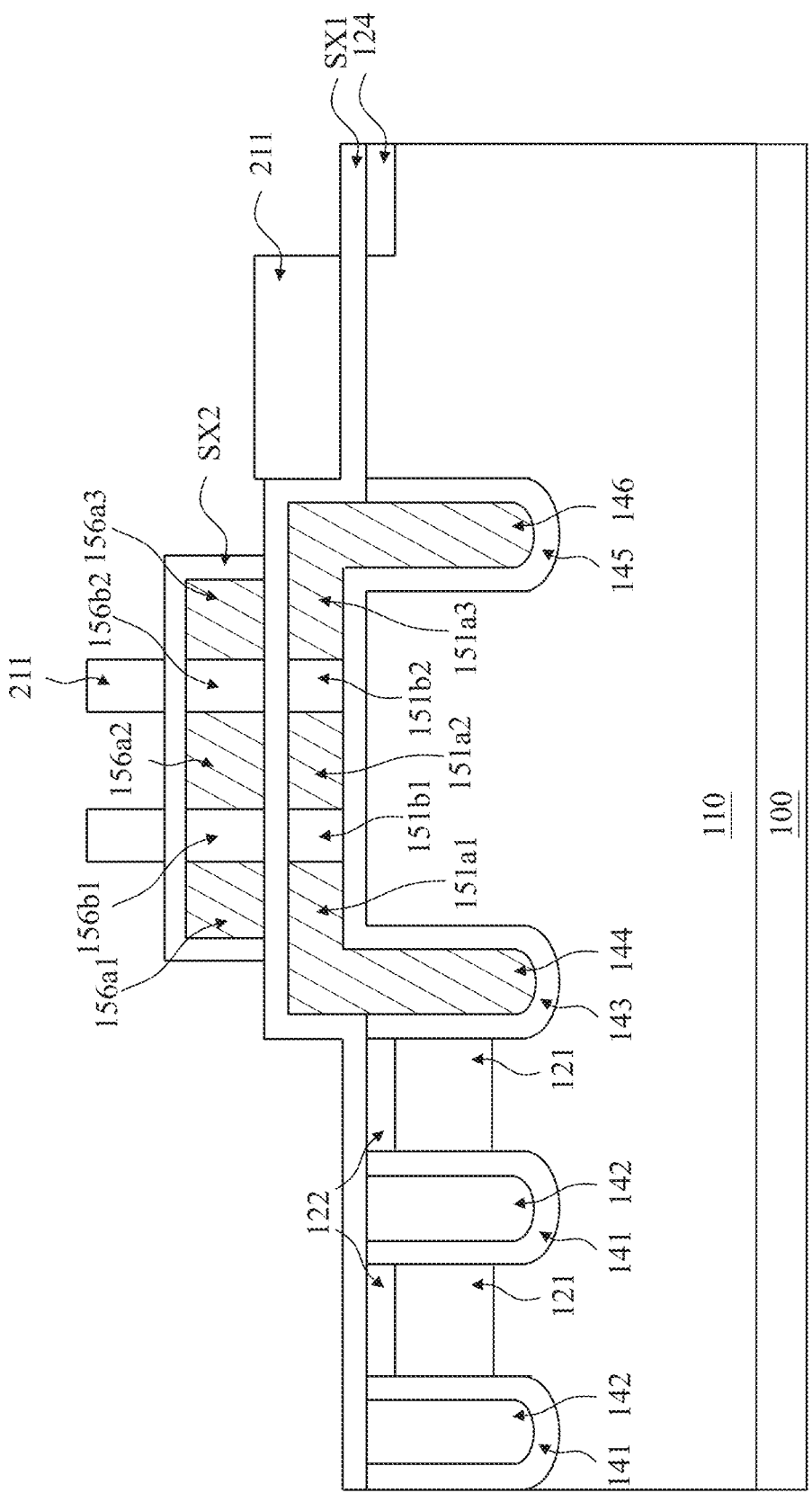

As shown in FIG. 24, a photoresist layer 211 may be formed on the spacing oxide layer SX2. The photoresist layer 211 is used to define a position of a doped region 156a, position of source doped region 122, and a position of a drain doped region 124. Next, in step S46, an ion implantation process is performed to the polysilicon 209, the lightly doped region 110 and the body doped regions 121 based on the photoresist layer 211, to form trench structures TR1 and source doped regions 122. The region on the polysilicon 209 without the photoresist layer 211 forms N-type (the first conductivity type) doped regions 156a1, 156a2, and 156a3. The upper portions of the body doped regions 121 form the source doped regions 122. The polysilicon 204 becomes polysilicon structures 142. A portion of the lightly doped region 110 forms a drain doped region 124. Because part of the polysilicon 209 is formed into the doped region 156a1, the doped region 156a2 and the doped region 156a3, the polysilicon 209 between the doped region 156a1 and the doped region 156a3 is the doped region 156b1 and the doped region 156b2. Therefore, the doped region 156a and the doped region 156b of the diode string 156 are formed in the step of FIG. 24, where the doped region 156a and the doped region 156b have different conductivity types.

Figure 25:
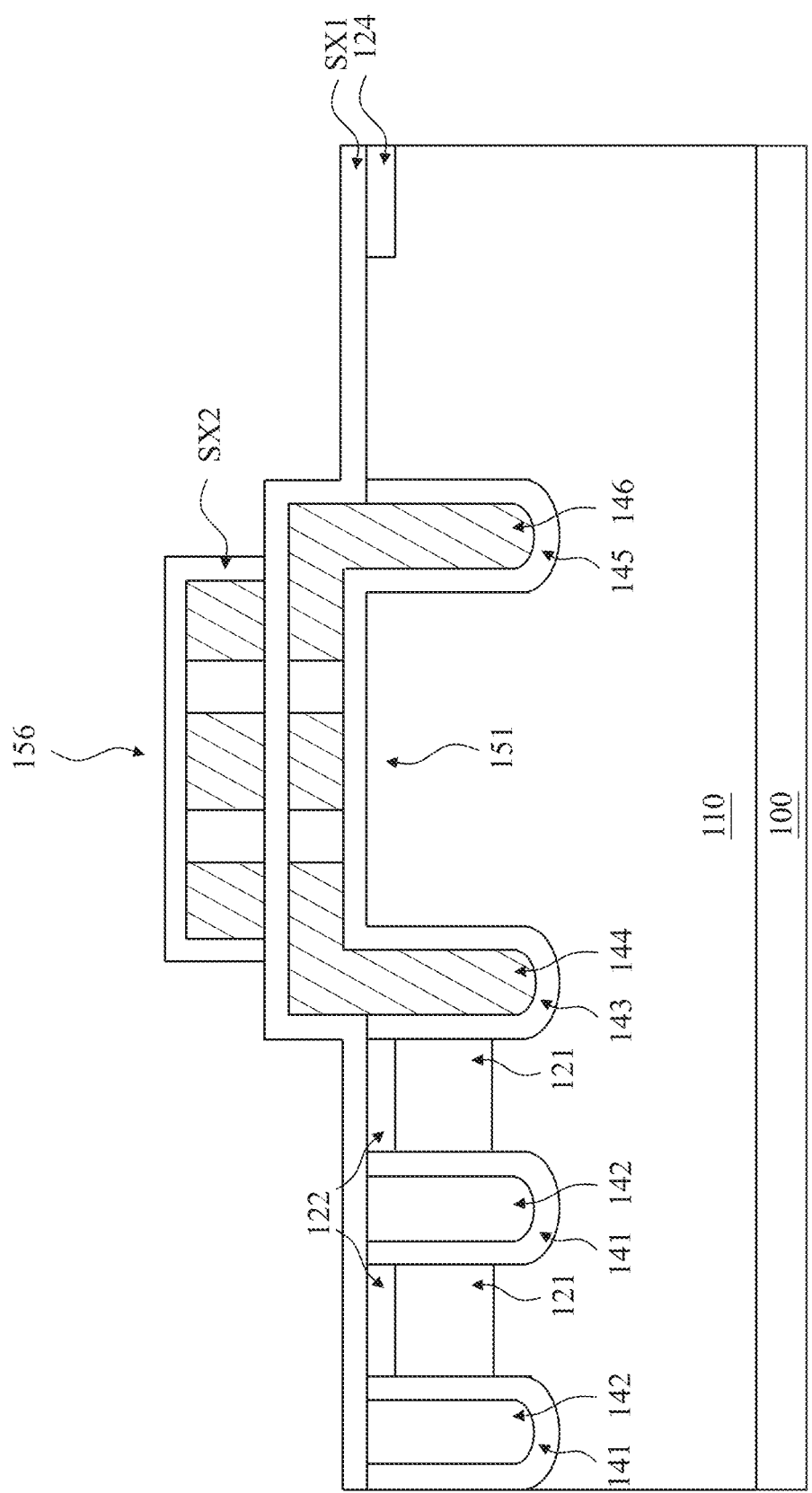

Referring to FIG. 25, after the ion implantation process is completed, the photoresist layer 211 is removed. In some embodiments, after the photoresist layer 211 is removed, a thermal annealing process may be performed on the polysilicon structures 142, the source doped regions 122, the doped region 156a, and the drain doped region 124.

Figure 26:
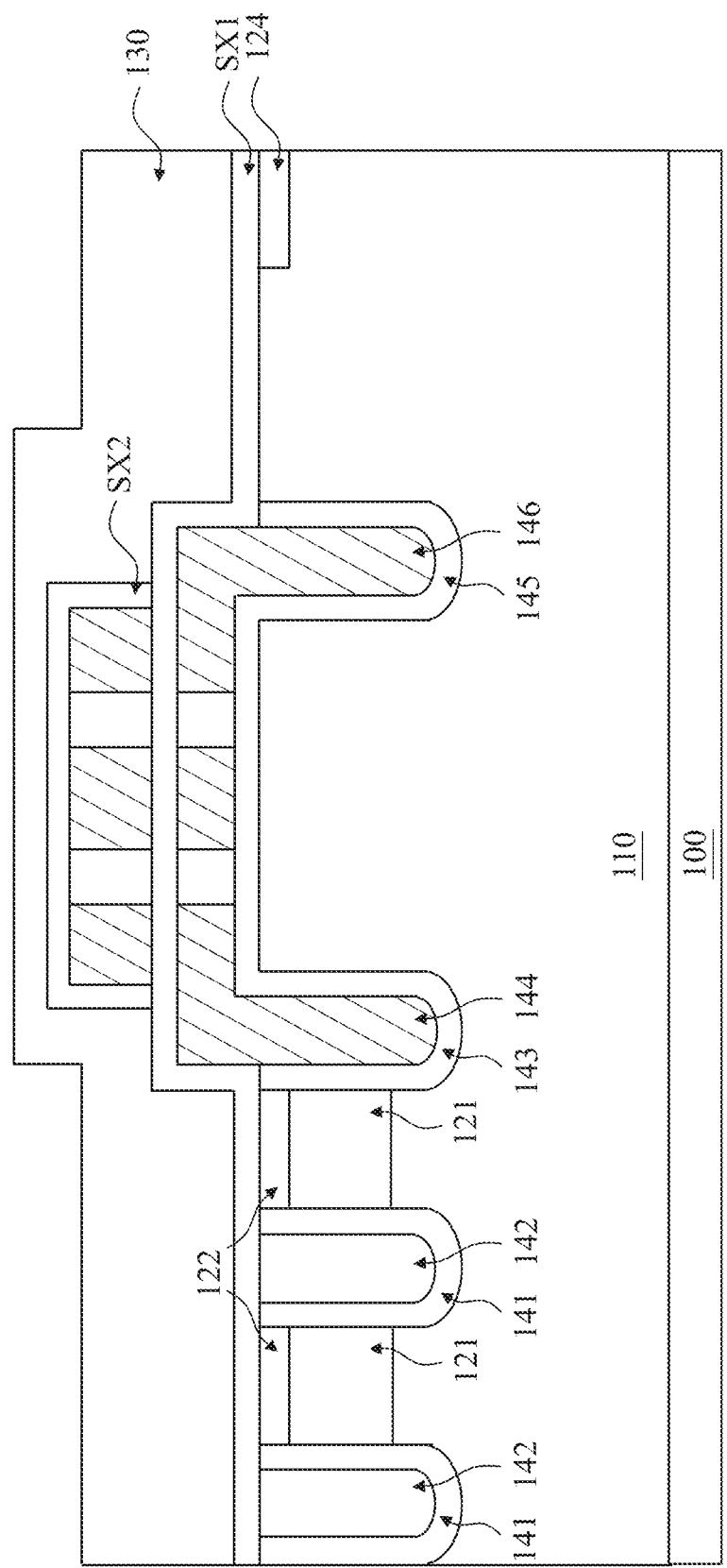

Referring to FIG. 26, an interlayer dielectric layer 130 is formed on the spacing oxide layer SX1 and the spacing oxide layer SX2.

Figure 27:
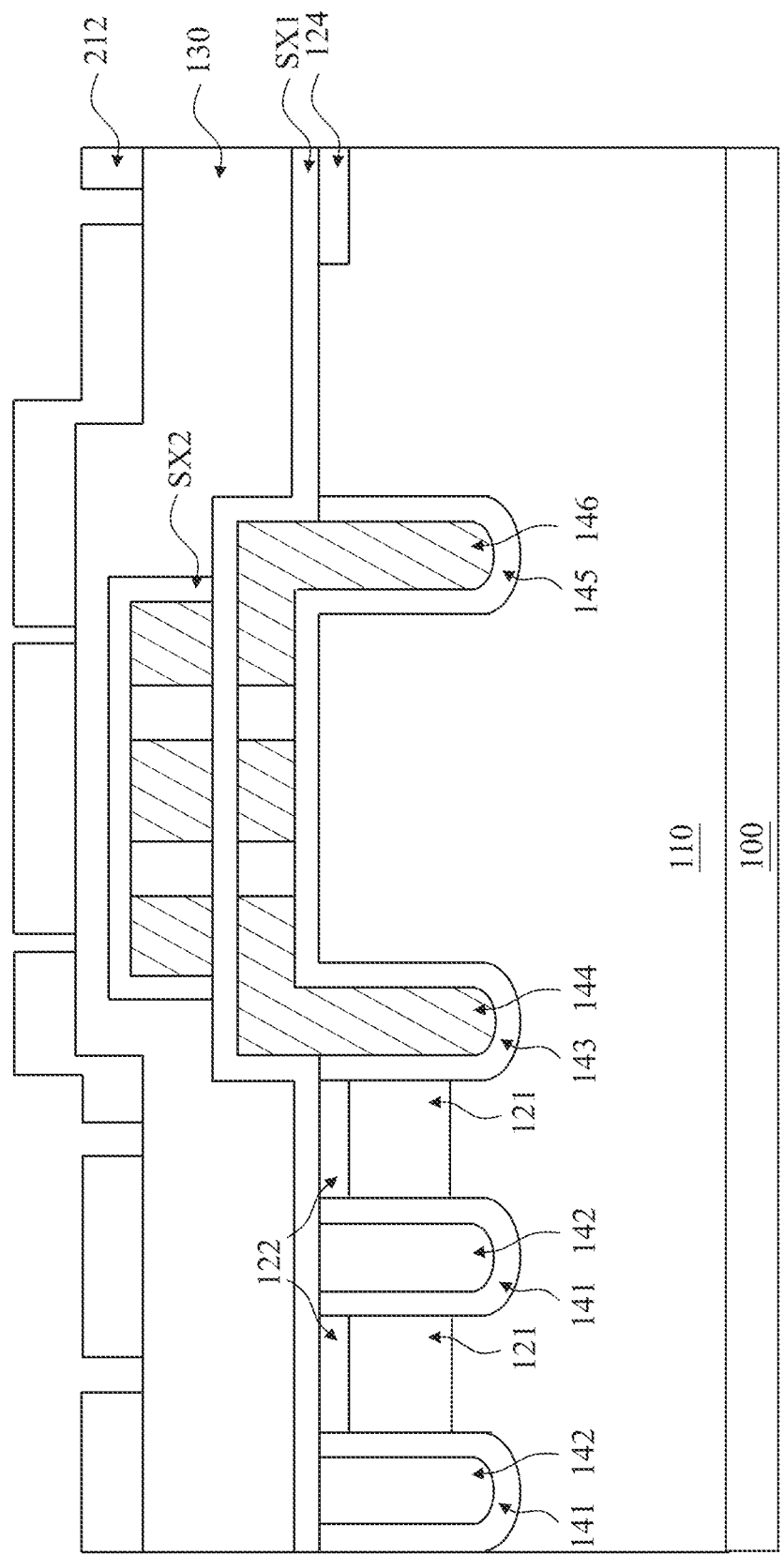

Referring to FIG. 27, a photoresist layer 212 may be formed on the interlayer dielectric layer 130. The photoresist layer 212 is used to define the positions of conductive plugs CP1, a conductive plug CP2, a conductive plug CP3 and a conductive plug CP4.

Figure 28:
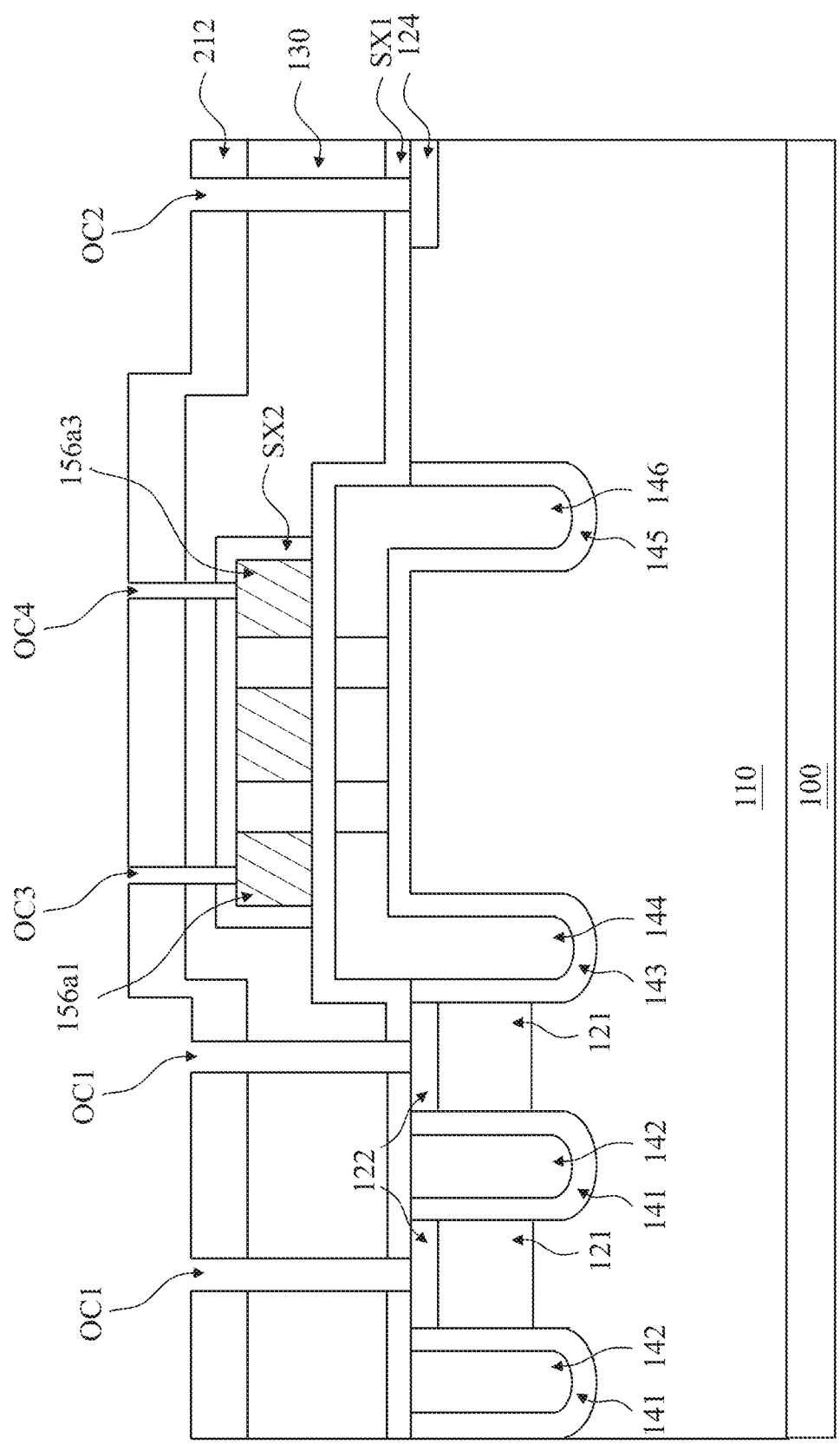

Referring to FIG. 28, based on the photoresist layer 212, an etching process may be performed on the interlayer dielectric layer 130, the spacing oxide layer SX1 and the spacing oxide layer SX2 to form openings OC1, an opening OC2, an opening OC3 and an opening OC4. Specifically, the openings OC1, the opening OC2, the opening OC3 and the opening OC4 correspond to the conductive plugs CP1, the conductive plug CP2, the conductive plug CP3 and the conductive plug CP4, respectively. A portion of the source doped regions 122 is exposed through the openings OC1; a portion of the drain doped region 124 is exposed through the opening OC2; a portion of the doped region 156a1 is exposed through the opening OC3; and a portion of the doped region 156a3 is exposed through the opening OC4.

Figure 29:
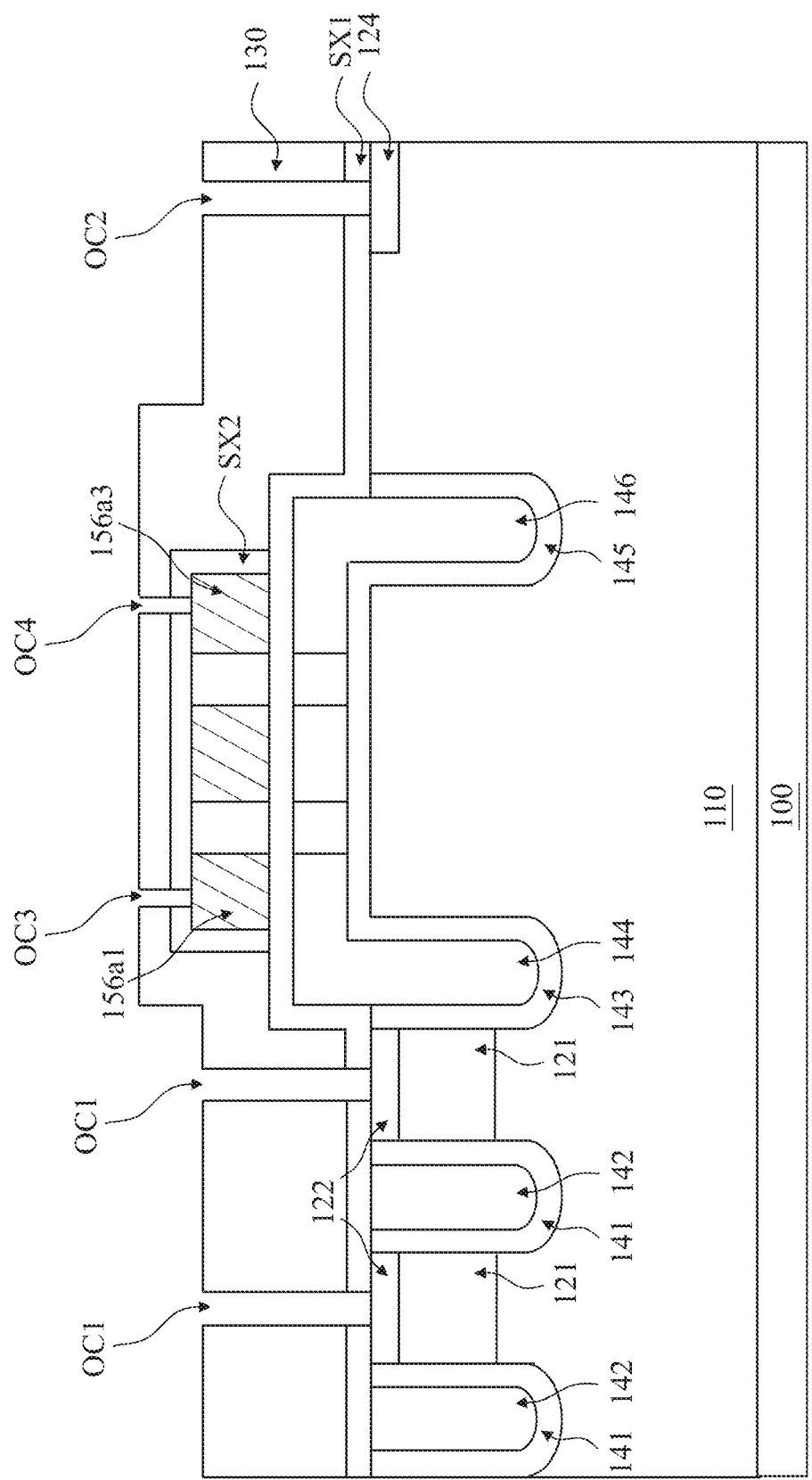

Referring to FIG. 29, after the etching process is completed, the photoresist layer 212 is removed.

Figure 30:
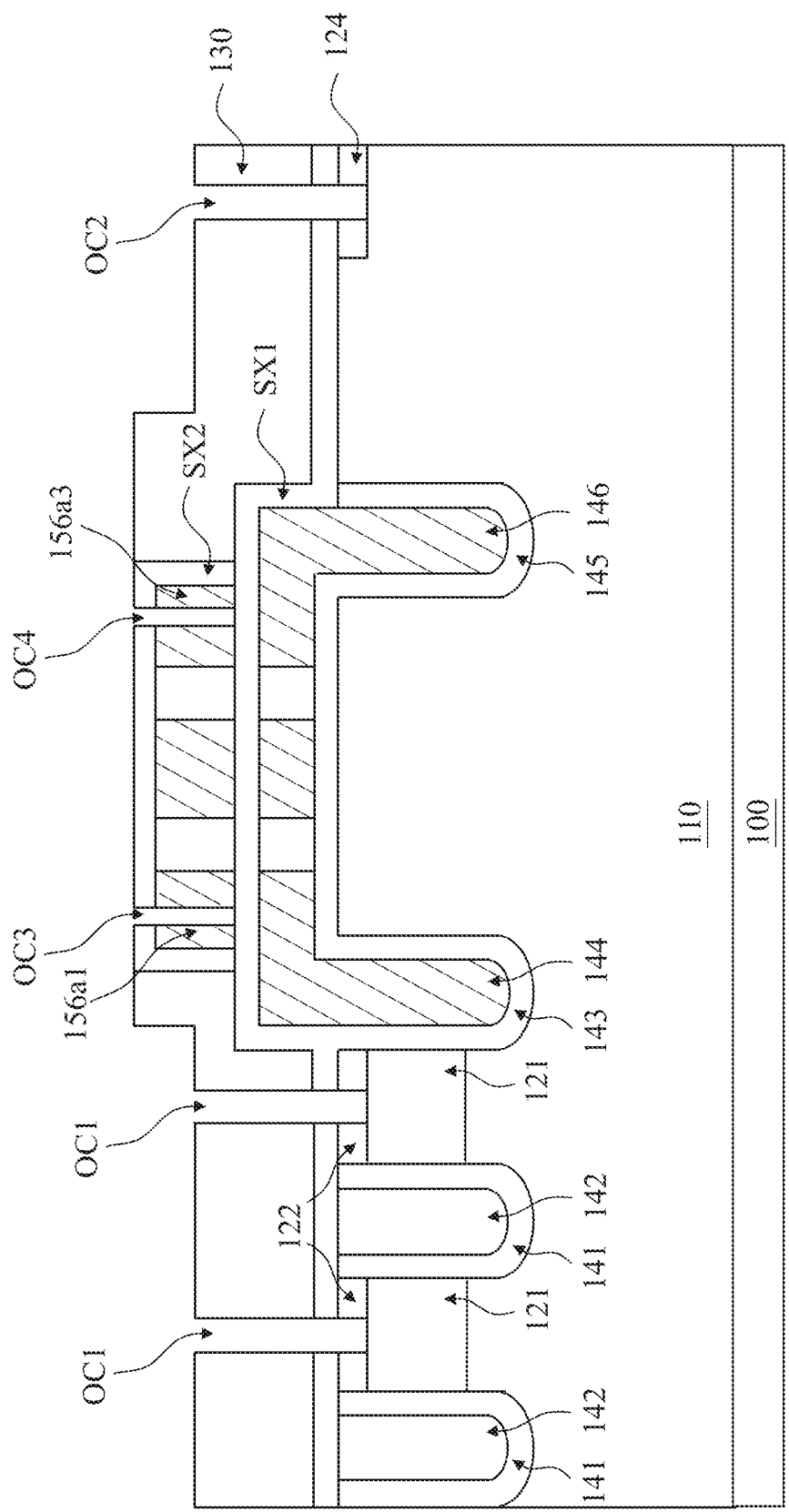

Referring to FIG. 30, an etching process may be performed on the source doped regions 122, the drain doped region 124, the doped region 156a1 and the doped region 156a3 through the openings OC1, the opening OC2, the opening OC3 and the opening OC4. After the etching process, the openings OC1 extend toward the substrate 100 to reach the top surface of the body doped regions 121, the opening OC2 extends toward the substrate 100 to reach the bottom surface of the drain doped region 124, and the openings OC3 and OC4 extend toward the substrate 100 to reach the top surface of the spacing oxide layer SX1. In some embodiments, the interlayer dielectric layer 130 may partially be etched at the same time, and thus the thickness of the interlayer dielectric layer 130 is reduced.

Figure 31:
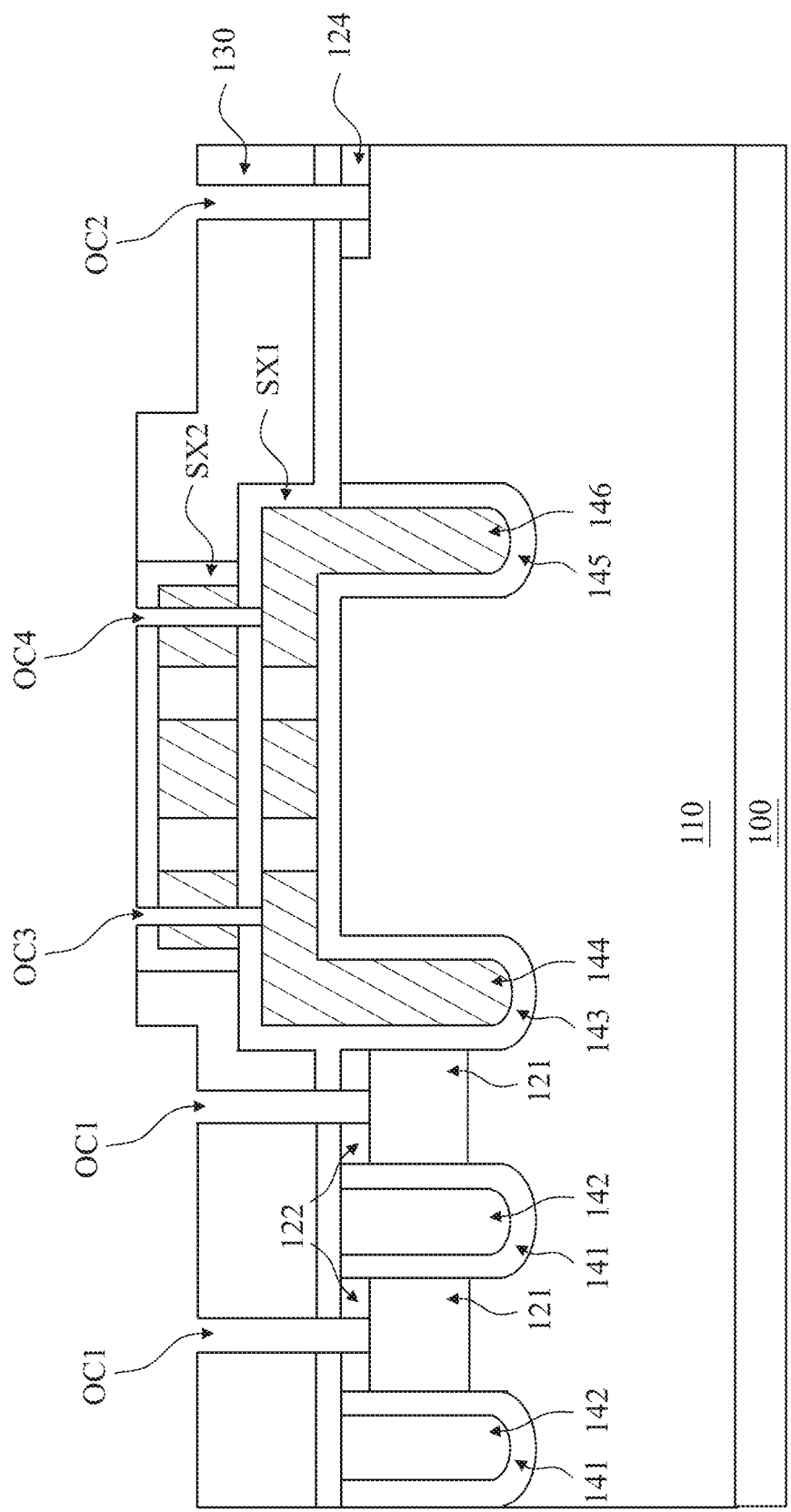

Referring to FIG. 31, an etching process may be performed on the spacing oxide layer SX1 through the opening OC3 and the opening OC4, such that the opening OC3 and the opening OC4 extend toward the substrate 100, and penetrate the spacing oxide layer SX1 to reach the top surfaces of the doped regions 151a1 and 151a3.

Figure 32:
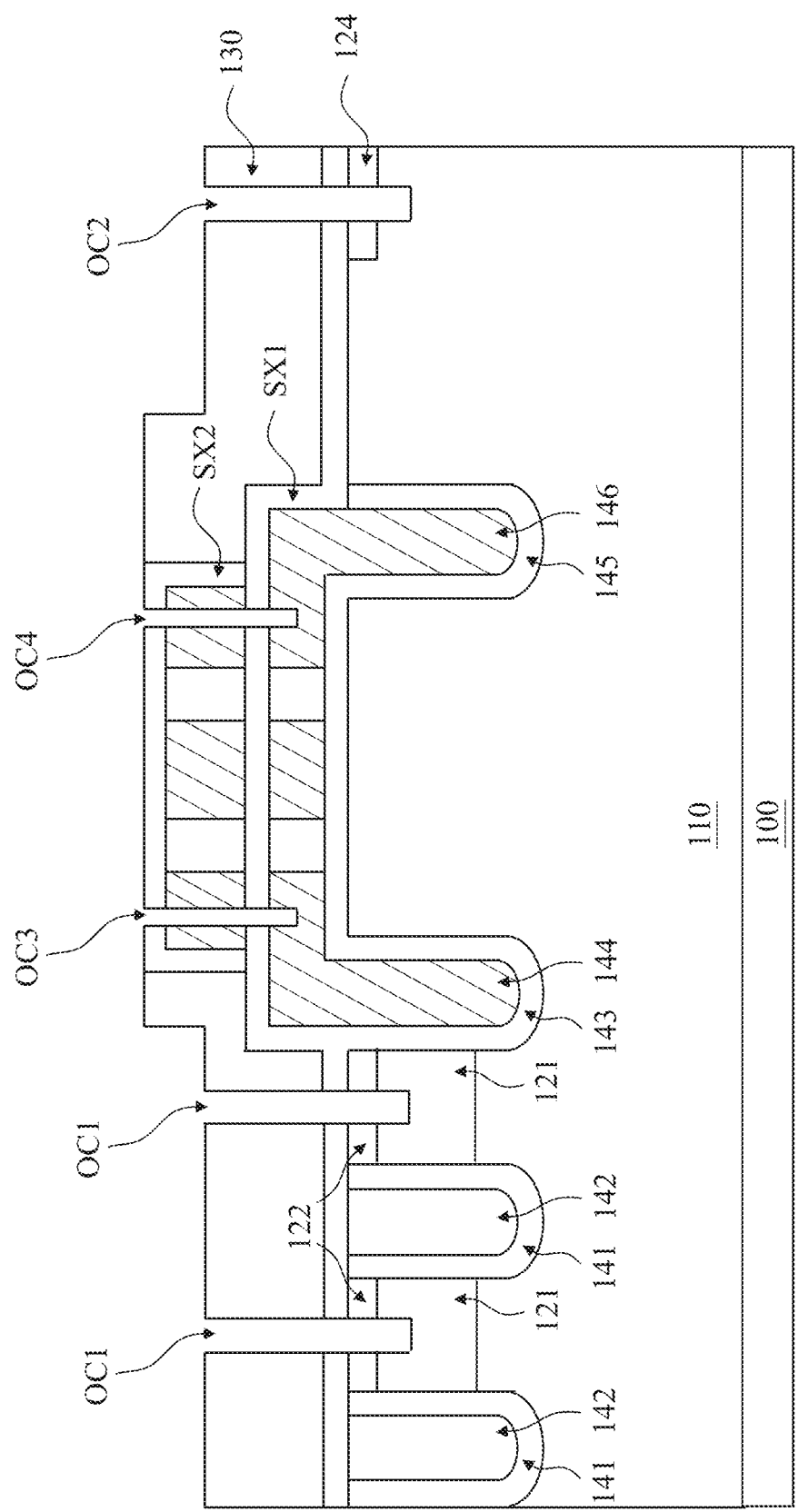

Referring to FIG. 32, an etching process may be performed on the body doped regions 121, the lightly doped layer 110, the doped region 151al and the doped region 151a3 through the openings OC1, the opening OC2, the opening OC3 and the opening OC4, respectively. After the etching process, the openings OC1 extend toward the substrate 100 into the body doped regions 121, the opening OC2 extends toward the substrate 100 into the lightly doped layer 110, the opening OC3 extends toward the substrate 100 into the doped region 151a1, and the opening OC4 extends toward the substrate 100 into the doped region 151a3.

Figure 33:
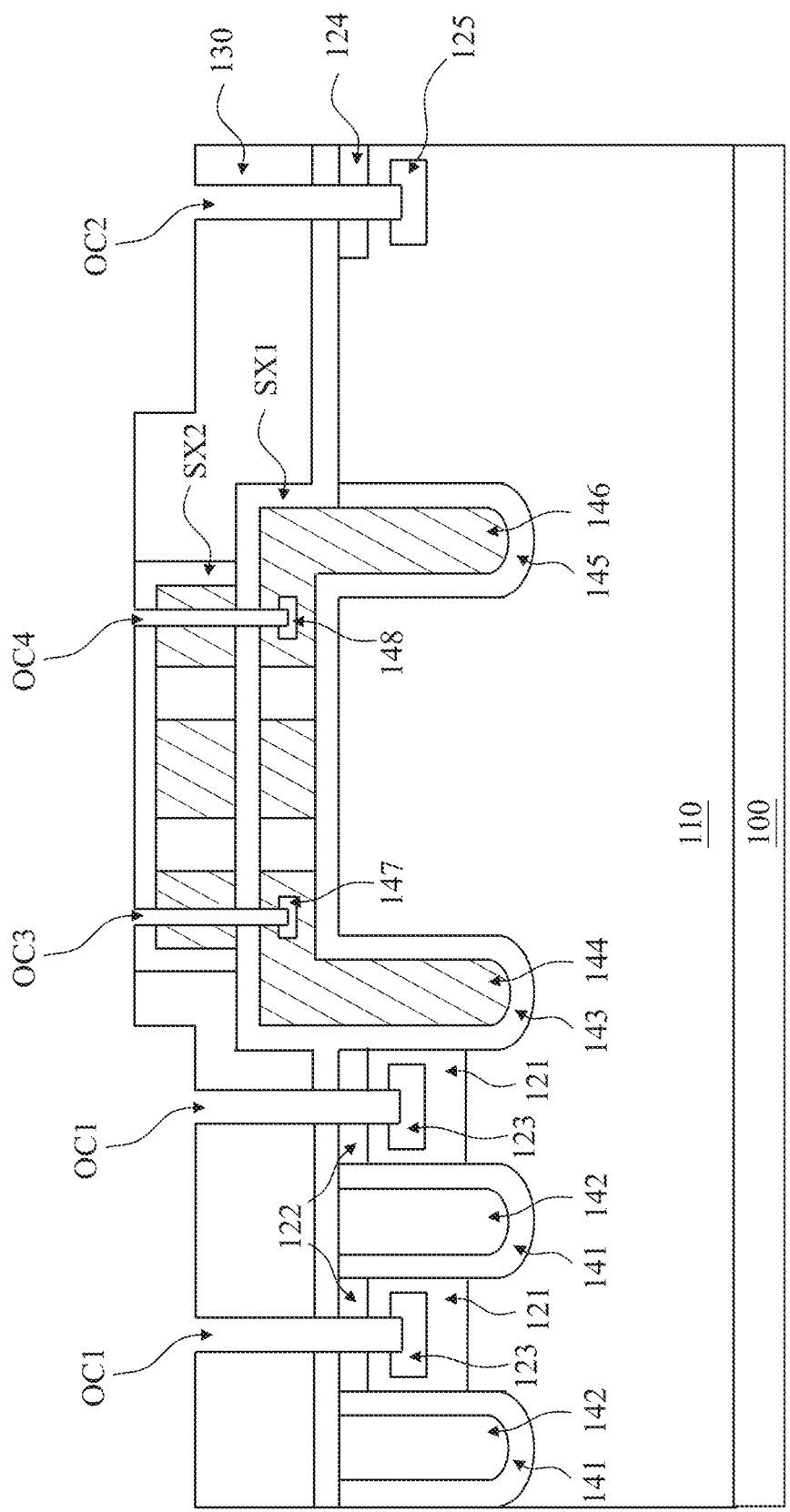

Referring to FIG. 33, an ion implantation process may be performed to the body doped regions 121, the lightly doped layer 110, the doped region 151al and the doped region 151a3 through the openings OC1, the opening OC2, the opening OC3 and the opening OC4, respectively, to form heavily doped regions 123, a heavily doped region 125, a heavily doped region 147 and a heavily doped region 148. The heavily doped regions 123, the heavily doped region 125, the heavily doped region 147 and the heavily doped region 148 are P-type (the second conductivity type) doped regions, and are used as ohmic contacts between the conductive plugs and the doped regions.

Figure 34:
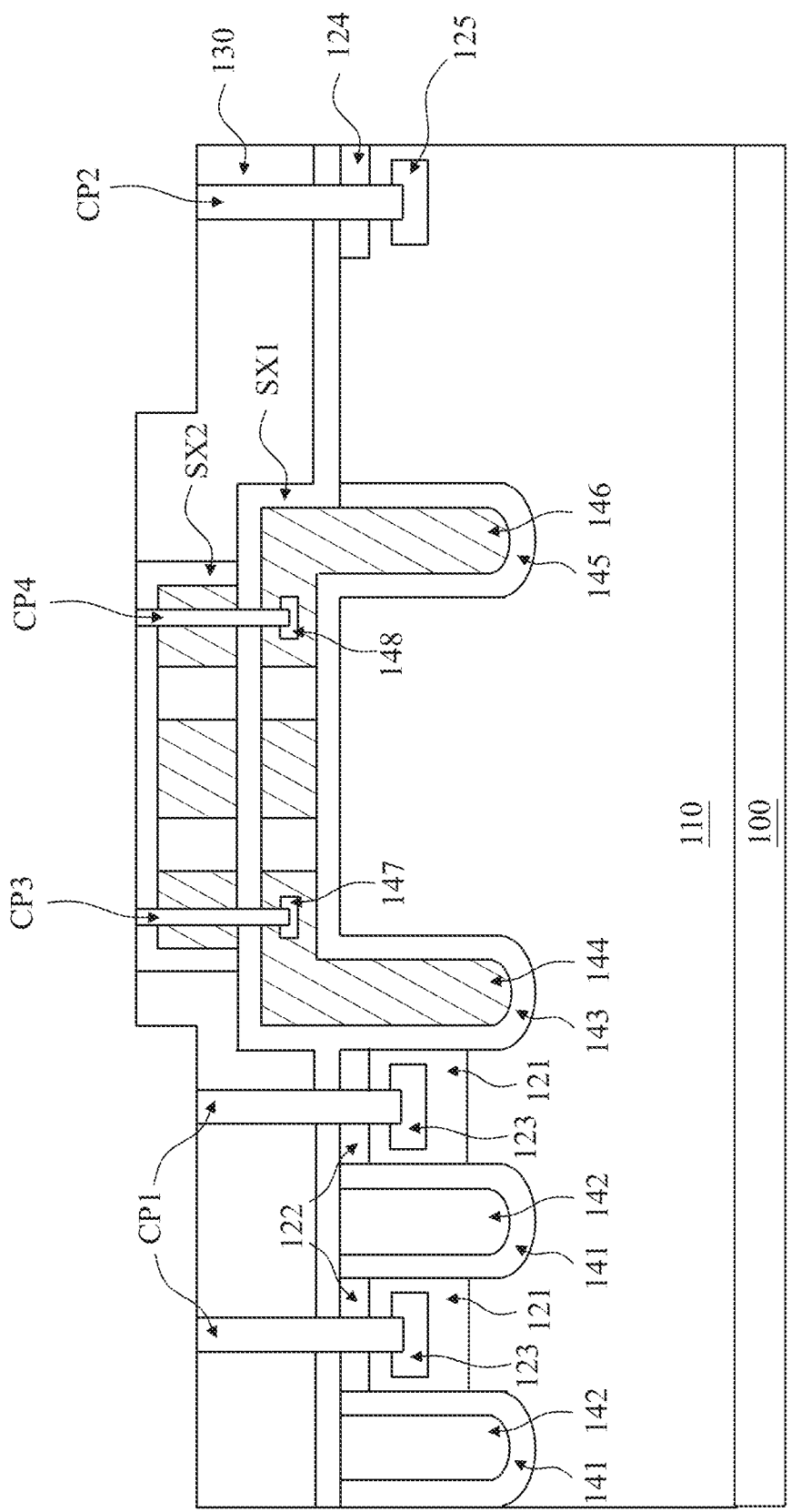

Referring to FIG. 34 and FIG. 2, in step S47, a source electrode S may be formed to couple to the source doped regions 122, and a gate electrode G may be formed to couple to the polysilicon structures 142. As shown in FIG. 34, a conductive material may be formed in the openings OC1, the opening OC2, the opening OC3 and the opening OC4 and on the interlayer dielectric layer 130, and then an etch-back process may be performed to make the top surface of the interlayer dielectric layer 130 coplanar with the top surface of the conductive material. After the openings OC1, the opening OC2, the opening OC3, and the opening OC4 are filled with the conductive material, the conductive plugs CP1, the conductive plug CP2, the conductive plug CP3, and the conductive plug CP4 are formed. In some embodiments, the conductive material filled may be metal. In some embodiments, the conductive material filled may be tungsten (W).

Referring back to FIG. 2, the metal wires 161, 162, and 163 may be formed on the interlayer dielectric layer 130, where the metal wires 161, 162, and 163 are separated from each other. The metal wire 161 is used to connect to the source electrode S; the metal wire 162 is used to connect to the gate electrode G; and the metal wire 163 is used to connect to the drain electrode D. The metal wire 161 adjoins the conductive plugs CP1 and the conductive plug CP3, such that the conductive plugs CP1 and the conductive plug CP3 can be electrically connected to the source electrode S through the metal wire 161. The metal wire 162 adjoins the conductive plug CP4, such that the conductive plug CP4 can be electrically connected to the gate electrode G through the metal wire 162. The metal wire 163 adjoins the conductive plug CP2, such that the conductive plug CP2 can be electrically connected to the drain electrode D through the metal wire 163.

It should be understood that the semiconductor power device 1 of the present disclosure is not limited to the above structure. For example, the gate of the semiconductor power device 1 may be implemented with different structures, which is also within the scope of the present disclosure.

Figure 35:
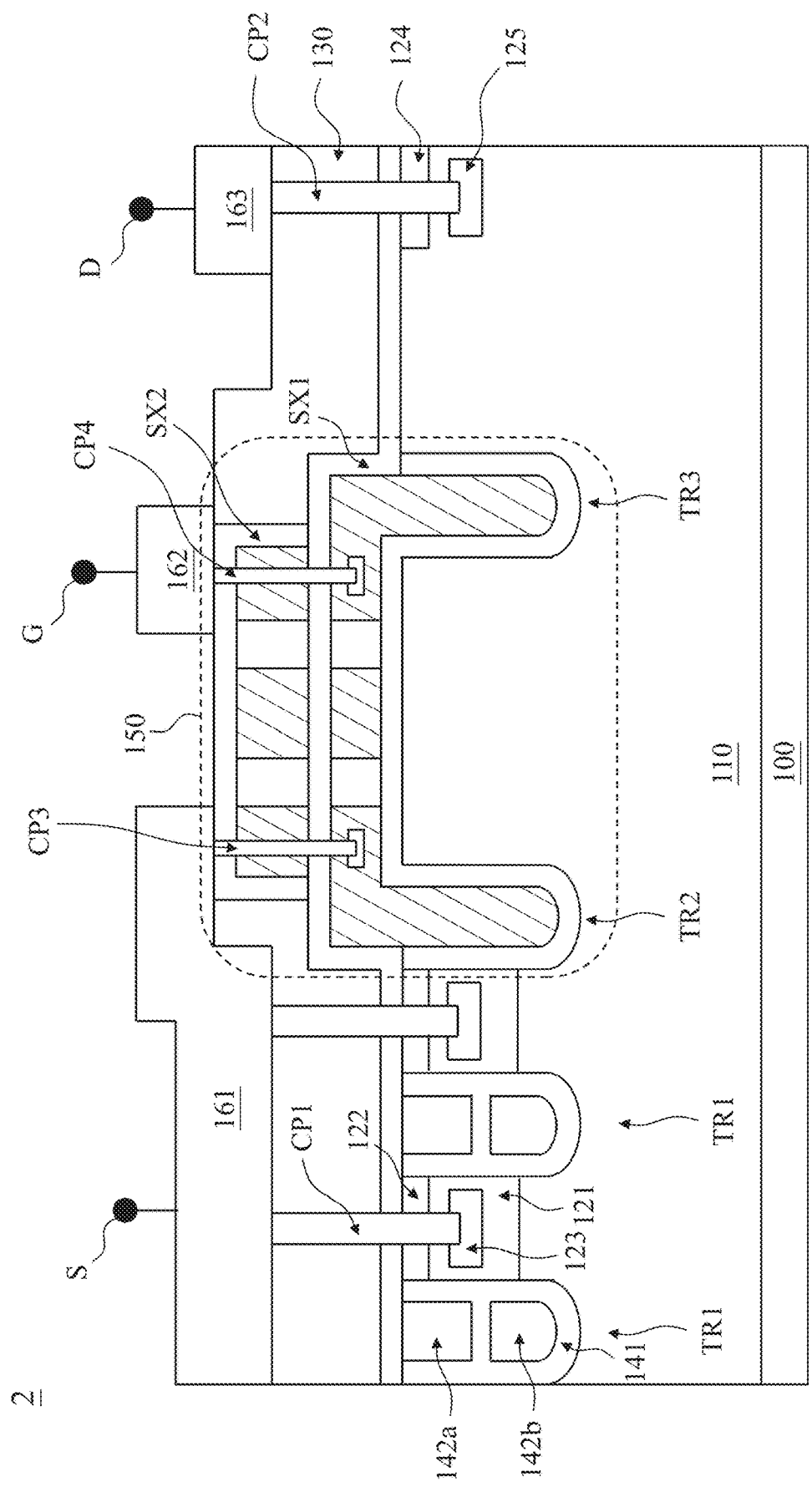
FIG. 35 is a schematic diagram of another example semiconductor power device according to embodiments of the present disclosure.
Figure 36:
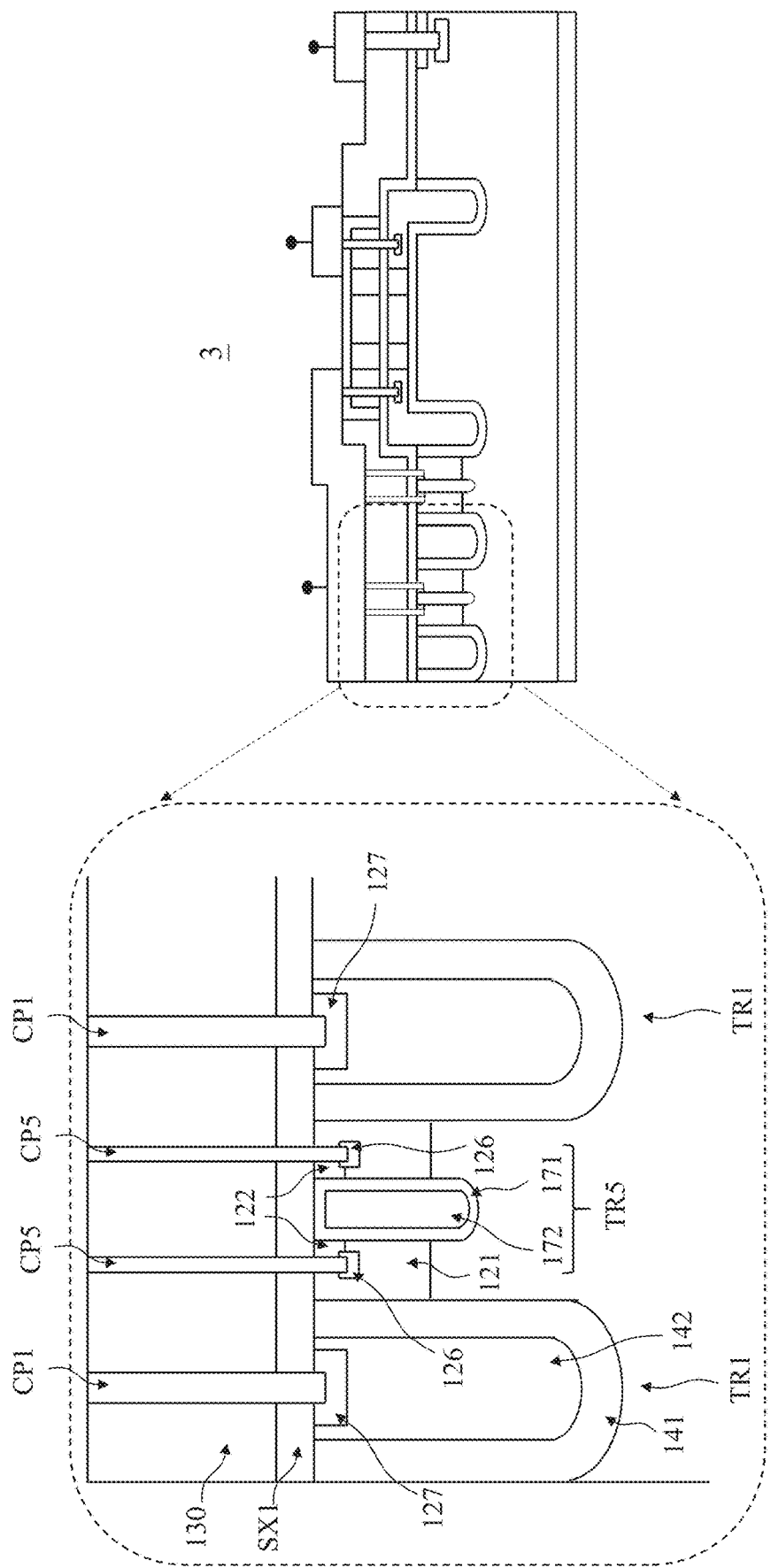
FIG. 36 is a schematic diagram of yet another example semiconductor power device and an enlarged view of a portion thereof according to embodiments of the present disclosure.

Referring to FIG. 35 and FIG. 36, FIG. 35 is a schematic diagram of another example semiconductor power device 2 according to embodiments of the present disclosure, and FIG. 36 is a schematic diagram of yet another example semiconductor power device 3 and a partially enlarged view thereof according to embodiments of the present disclosure. For ease of understanding, the symbols in FIG. 35 and FIG. 36 follow the symbols in FIG. 1, FIG. 2, FIG. 3A and FIG. 3B, which, however, does not mean that the components using the same symbols must be the same.

The semiconductor power device 2 is substantially similar to the semiconductor power device 1, except for the trench structures. Specifically, the trench structures TR1 of the semiconductor power device 2 are arranged in a form of split-gate. A trench structure TR1 of the semiconductor power device 2 has two separated polysilicon structures, namely, a polysilicon structure 142a and a polysilicon structure 142b, where the polysilicon structure 142a is arranged above the polysilicon structure 142b. In addition, the oxide layer 141 of the trench structure TR1 may further extend between the polysilicon structure 142a and the polysilicon structure 142b. In some embodiments, the polysilicon structure 142a may be a part of the gate structure, and the polysilicon structure 142b may be a part of the source structure.

The semiconductor power device 3 is substantially similar to the semiconductor power device 1, except that the power transistor of the semiconductor power device 3 includes a dual trench structure. The semiconductor power device 3 further includes trench structures TR5, conductive plugs CP5, heavily doped regions 126, and heavily doped regions 127. The trench structures TR5 are disposed between two trench structures TR1, and between the trench structure TR2 and a trench structure TR1 adjacent to the trench structure TR2. As an example, FIG. 36 shows two trench structures TR5. One trench structure TR5 is between the two trench structures TR1, and the other one is between the trench structure TR2 and a trench structure TR1 adjacent to the trench structure TR2. The trench structures TR5 are disposed in the lightly doped layer 110, extend toward the substrate 110 and through the source doped regions 122, and protrude out of the body doped regions 121. The depth of the trench structures TR5 may be less than the depth of the trench structures TR1.

Taking a trench structure TR5 as an example for illustration, the trench structure TR5 may include a polysilicon structure 172 and an oxide layer 171 surrounding the polysilicon structure 172. Two conductive plugs CP5 are disposed on two sides of the trench structure TR5. The conductive plugs CP5 are connected to the metal wire 161, and extend through the interlayer dielectric layer 130, the spacing oxide layer SX1 and the source doped region 122 to reach the heavily doped regions 126 in the body doped region 121.

The heavily doped regions 127 are disposed in the polysilicon structures 142 and adjoin the spacing oxide layer SX1. The conductive plugs CP1 are disposed on the trench structures TR1 and extend into the heavily doped regions 127. In some embodiments, the oxide layer 171 and the polysilicon structure 172 may be part of the gate structure, and the oxide layer 141 and the polysilicon structure 142 may be part of the source structure.

In accordance with an aspect of the present disclosure, an electrostatic discharge protection structure is provided that includes: a first trench structure, comprising a first polysilicon structure and a first oxide layer surrounding the first polysilicon structure; a second trench structure, comprising a second polysilicon structure and a second oxide layer surrounding the second polysilicon structure; a first diode string, adjoining the first polysilicon structure and the second polysilicon structure, and disposed between the first trench structure and the second trench structure; a first spacing oxide layer, disposed on the first diode string; and a second diode string disposed on the first spacing oxide layer and connected in parallel with the first diode string.

Optionally, in any of the preceding aspects, the first diode string comprises: a plurality of first doped regions of a first conductivity type; and a plurality of second doped regions of a second conductivity type, wherein the plurality of first doped regions and the plurality of second doped regions are alternately arranged, and a PN junction is formed at an interface between each first doped region and an adjacent second doped region.

Optionally, in any of the preceding aspects, a first end of the plurality of first doped regions adjoins the first polysilicon structure, and a second end of the plurality of first doped regions adjoins the second polysilicon structure.

Optionally, in any of the preceding aspects, the first polysilicon structure and the second polysilicon junction have the first conductivity type.

Optionally, in any of the preceding aspects, the first conductivity type is N-type, and the second conductivity type is P-type.

Optionally, in any of the preceding aspects, the second diode string comprises: a plurality of third doped regions of the first conductivity type; and a plurality of fourth doped regions of the second conductivity type, wherein the plurality of third doped regions and the plurality of fourth doped regions are alternately arranged, and a PN junction is formed at an interface between each third doped region and an adjacent fourth doped region.

Optionally, in any of the preceding aspects, the electrostatic discharge protection structure may further include: a first conductive plug, passing through a first end of the plurality of third doped regions and the first spacing oxide layer to reach the first end of the plurality of first doped regions, and coupling a first electrode to the first end of the plurality of third doped regions and the first end of the plurality of first doped regions; a second conductive plug, passing through a second end of the plurality of third doped regions and the first spacing oxide layer to reach the second end of the plurality of first doped regions, and coupling a second electrode to the second end of the plurality of third doped regions and the second end of the plurality of first doped regions; a first heavily doped region disposed in the first end of the plurality of first doped regions and surrounding an end of the first conductive plug; and a second heavily doped region disposed in the second end of the plurality of first doped regions and surrounding an end of the second conductive plug.

Optionally, in any of the preceding aspects, the electrostatic discharge protection structure may further include: a second spacing oxide layer disposed on the second diode string and surrounding the second diode string.

Optionally, in any of the preceding aspects, the first oxide layer and the second oxide layer are adjacent to each other, and wherein the first diode string is disposed between the first spacing oxide layer and the first oxide layer and the second oxide layer adjacent to each other.

Optionally, in any of the preceding aspects, each of the first diode string and the second diode string comprises a plurality of back-to-back diodes coupled in series.

In accordance with another aspect of the present disclosure, a semiconductor power device is provided that includes: a substrate; a lightly doped layer, disposed on the substrate; a first trench structure, disposed in the lightly doped layer and extending toward the substrate, wherein the first trench structure comprises a first polysilicon structure and a first oxide layer surrounding the first polysilicon structure; a source doped region, disposed in the lightly doped layer and away from the substrate; an interlayer dielectric layer disposed on the lightly doped layer; a source electrode coupled to the source doped region; a gate electrode coupled to the first polysilicon structure; and an electrostatic discharge protection structure, disposed in the interlayer dielectric layer, and comprising: a first diode string; a second diode string, disposed on the first diode string; and a first spacing oxide layer, disposed between the first diode string and the second diode string; and wherein the first diode string and the second diode string are connected in parallel between the source electrode and the gate electrode.

Optionally, in any of the preceding aspects, the electrostatic discharge protection structure further comprises: a second spacing oxide layer, disposed on the second diode string and a side surface of the second diode string, and adjacent to the first spacing oxide layer.

Optionally, in any of the preceding aspects, each of the first diode string and the second diode string comprises: a plurality of first doped regions of a first conductivity type; a plurality of second doped regions of a second conductivity type, wherein the plurality of second doped regions and the plurality of first doped regions are arranged alternately, and a PN junction is formed at an interface between each first doped region and an adjacent second doped region.

Optionally, in any of the preceding aspects, the semiconductor power device may further includes: a first conductive plug, passing through the second diode string and the first spacing oxide layer to reach the first diode string, and coupling the source electrode to a first end of the plurality of first doped regions of the first diode string, and to a first end of the plurality of first doped regions of the second diode string; and a second conductive plug, passing through the second diode string and the first spacing oxide layer to reach the first diode string, and coupling the gate electrode to a second end of the plurality of first doped regions of the first diode string and a second end of the plurality of first doped regions of the second diode string; a first heavily doped region, disposed in a first end of the plurality of first doped regions of the first diode string and surrounding an end of the first conductive plug; and a second heavily doped region, disposed in the second end of the plurality of first doped regions of the first diode string and surrounding an end of the second conductive plug.

Optionally, in any of the preceding aspects, the first conductivity type is N-type, and the second conductivity type is P-type.

Optionally, in any of the preceding aspects, the semiconductor power device may further includes: a body doped region, disposed in the lightly doped layer and adjoining the first oxide layer; and a drain doped region, disposed in the lightly doped layer, wherein the source doped region is disposed in the body doped region.

Optionally, in any of the preceding aspects, the first spacing oxide layer extends to a sidewall of the first diode string and the lightly doped layer, and covers the source doped region, the drain doped region and the first trench structure.

Optionally, in any of the preceding aspects, the semiconductor power device may further includes: a third heavily doped region disposed in the body doped region; and a third conductive plug, coupled to the source electrode and extending through the interlayer dielectric layer and the source doped region to reach the body doped region, wherein the third heavily doped region surrounds one end of the third conductive plug.

Optionally, in any of the preceding aspects, the semiconductor power device may further includes: a drain electrode, disposed on the interlayer dielectric layer; a fourth heavily doped region, disposed in the body doped region; and a fourth conductive plug, coupled to the drain electrode, and extending through the interlayer dielectric layer and the drain doped region to reach the lightly doped layer, wherein the fourth heavily doped region surrounds one end of the fourth conductive plug.

Optionally, in any of the preceding aspects, a breakdown voltage of the first diode string is substantially equal to a breakdown voltage of the second diode string.

Optionally, in any of the preceding aspects, a breakdown voltage of the first diode string is less than a breakdown voltage of the first oxide layer.

In accordance with another aspect of the present disclosure, a manufacturing method of a semiconductor power device is provided that includes: forming a lightly doped layer on a substrate; forming, on the lightly doped layer, a first opening, a second opening and a third opening extending toward the substrate; forming a first diode string on the second opening and the third opening; forming a first spacing oxide layer on the first diode string, the first spacing oxide layer surrounding the first diode string; forming a second diode string on the first spacing oxide layer; forming a first trench structure in the first opening, wherein the first trench structure comprises a first polysilicon structure and a first oxide layer surrounding the first polysilicon structure; forming a source doped region in the lightly doped layer, wherein the source doped region is disposed between the first trench structure and the second opening; and forming a source electrode coupled to the source doped region, and forming a gate electrode coupled to the first polysilicon structure, wherein the first diode string and the second diode string are connected in parallel and arranged between the source electrode and the gate electrode.

Optionally, in any of the preceding aspects, the manufacturing method may further includes: forming a second spacing oxide layer, the second spacing oxide layer being disposed on the second diode string, surrounding the second diode string, and adjacent to the first spacing oxide layer; and forming an interlayer dielectric layer on the lightly doped layer, wherein the source electrode and the gate electrode are formed on the interlayer dielectric layer.

Optionally, in any of the preceding aspects, the manufacturing method may further includes: forming a first conductive plug, a second conductive plug and a third conductive plug, wherein the first conductive plug passes through the interlayer dielectric layer and the first spacing oxide layer to reach the source doped region, and the second conductive plug and the third conductive plug pass through the second spacing oxide layer, the second diode string and the first spacing oxide layer to reach the first diode string.

Optionally, in any of the preceding aspects, the first conductive plug couples the source electrode to the source doped region, the second conductive plug couples the source electrode to the first diode string and the second diode string, and the third conductive plug couples the gate electrode to the first diode string and the second diode string.

Optionally, in any of the preceding aspects, the manufacturing method may further includes: forming a drain doped region in the lightly doped layer; forming a fourth conductive plug passing through the interlayer dielectric layer and the first spacing oxide layer to reach the drain doped region; and forming a drain electrode, wherein the fourth conductive plug couples the drain electrode to the drain doped region.

Optionally, in any of the preceding aspects, the step of forming the first diode string on the second opening and the third opening comprises: forming a first semiconductor material in the second opening and the third opening; and patterning the first semiconductor material; and performing ion implantation on the patterned first semiconductor material to form a plurality of first doped regions having a first conductivity type and a plurality of second doped regions having a second conductivity type, wherein the plurality of first doped regions and the plurality of second doped regions are alternately arranged, and a PN junction is formed at an interface between each first doped region and an adjacent second doped region.

Optionally, in any of the preceding aspects, the step of forming the second diode string on the first spacing oxide layer comprises: forming a second semiconductor material in the first spacing oxide layer; and patterning the second semiconductor material; and performing ion implantation on the patterned second semiconductor material to form a plurality of third doped regions having the first conductivity type and a plurality of fourth doped regions having the second conductivity type, wherein the plurality of third doped regions and the plurality of fourth doped regions are alternately arranged, and a PN junction is formed at an interface between each third doped region and an adjacent fourth doped region.

In the present disclosure, for description convenience, spatially relative terms such as "below", "under", "lower", "above", "upper", "left side", "right side", and so on, may be used to describe the relationship of one component or feature with another one or more components or features, as shown in the accompanying drawings. In addition to the orientations depicted in the accompanying drawings, the spatially relative terms are also intended to encompass different orientations of a device in use or operation. A device may be oriented in other ways (rotated 90 degrees or in other orientations), and the spatially relative terms used herein may be interpreted in a corresponding way similarly. It should be understood that when a component is referred to as being "connected to" or "coupled to" another component, it can be directly connected or coupled to another component or an intervening component may be present.

As used herein, the terms "approximately", "basically", "substantially" and "about" are used to describe and account for small variations. When used in conjunction with an event or instance, the terms may refer to an embodiment of exact occurrence of an event or instance as well as an embodiment where the event or instance is close to the occurrence. As used herein with respect to a given value or range, the term "about" generally means being within ±10%, ±5%, ±1%, or ±0.5% of the given value or range. A range herein may be referred to as being from one endpoint to the other or as being between two endpoints. All ranges disclosed herein are inclusive of the endpoints unless otherwise indicated. The term "substantially coplanar" may mean that the difference of positions of two surfaces with reference to the same plane is within a few micrometers (μm), e.g., within 10

µm, within 5 µm, within 1 µm, or within 0.5 µm. When values or characteristics are referred to as being "substantially" the same, the term may refer to a value that is within ±10%, ±5%, ±1%, or ±0.5% of the mean of the values.

The foregoing has outlined features of some embodiments and detailed aspects of present disclosure. The embodiments described in the present disclosure may be readily used as a basis for designing or modifying other processes and structures in order to carry out the same or similar purposes and/or to achieve the same or similar advantages of the embodiments presented herein. Such equivalent constructions do not depart from the spirit and scope of the present disclosure, and various changes, substitutions, and alterations can be made without departing from the spirit and scope of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, which may perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed:

1. A semiconductor power device, comprising:
   a lightly doped layer disposed on a substrate;
   a first trench structure, disposed in the lightly doped layer and extending toward the substrate, wherein the first trench structure comprises a first polysilicon structure and a first oxide layer surrounding the first polysilicon structure;
   an interlayer dielectric layer disposed on the lightly doped layer;
   a source electrode coupled to a source doped region that is disposed in the lightly doped layer;
   a gate electrode coupled to the first polysilicon structure; and
   an electrostatic discharge protection structure disposed in the interlayer dielectric layer, comprising:
   a first diode string;
   a second diode string, disposed over the first diode string, wherein the second diode string and the first diode string are connected in parallel between the source electrode and the gate electrode; and
   a first spacing oxide layer, disposed between the first diode string and the second diode string.

2. The semiconductor power device of claim 1, wherein the electrostatic discharge protection structure further comprises:
   a second spacing oxide layer, disposed on the second diode string and a sidewall of the second diode string, and adjoining the first spacing oxide layer.

3. The semiconductor power device of claim 1, wherein each of the first diode string and the second diode string comprises:
   a plurality of first doped regions of a first conductivity type;
   a plurality of second doped regions of a second conductivity type, wherein the plurality of second doped regions and the plurality of first doped regions are arranged alternately, and a PN junction is formed at an interface between each first doped region and a second doped region adjacent to the each first doped region.

4. The semiconductor power device of claim 3, wherein the electrostatic discharge protection structure further comprises:
   a second trench structure, comprising a second polysilicon structure and a second oxide layer surrounding the second polysilicon structure; and
   a third trench structure, comprising a third polysilicon structure and a third oxide layer surrounding the second polysilicon structure,
   wherein each of the second trench structure and the third trench structure is disposed in the lightly doped layer and extends toward the substrate.

5. The semiconductor power device of claim 4, wherein the second polysilicon structure and the third polysilicon structure have the first conductivity type.

6. The semiconductor power device of claim 4, wherein the first diode string is coupled between the second polysilicon structure and the third polysilicon structure,
   wherein the second polysilicon structure and one of the plurality of first doped regions form a single continuous structure, and the third polysilicon structure and another one of the plurality of first doped regions form another single continuous structure.

7. The semiconductor power device of claim 1, further comprising:
   a first conductive plug, extending through the second diode string and the first spacing oxide layer and into the first diode string, the first conductive plug coupling the source electrode to a first end of the first diode string and to a first end of the second diode string; and
   a second conductive plug, extending through the second diode string and the first spacing oxide layer and into the first diode string, the second conductive plug coupling the gate electrode to a second end of the first diode string and to a second end of the second diode string;
   a first heavily doped region, disposed in the first end of the first diode string and surrounding an end of the first conductive plug; and
   a second heavily doped region, disposed in the second end of the first diode string and surrounding an end of the second conductive plug.

8. The semiconductor power device of claim 1, further comprising:
   a body doped region, disposed in the lightly doped layer and adjoining the first oxide layer, wherein the source doped region is disposed in the body doped region;
   a third heavily doped region disposed in the body doped region; and
   a third conductive plug, coupled to the source electrode, and extending through the interlayer dielectric layer and the source doped region and into the body doped region, wherein the third heavily doped region surrounds one end of the third conductive plug.

9. The semiconductor power device of claim 1, further comprising:
   a drain doped region disposed in the lightly doped layer;
   a fourth heavily doped region, disposed in the lightly doped region below the drain doped region; and
   a fourth conductive plug, coupled to a drain electrode of the semiconductor power device, and extending through the interlayer dielectric layer and the drain doped region and into the lightly doped layer, wherein the fourth heavily doped region surrounds one end of the fourth conductive plug.

10. The semiconductor power device of claim 9, further comprising:
a third metal wire, disposed on the interlayer dielectric layer and coupled between the fourth conductive plug and the drain electrode.

11. The semiconductor power device of claim 1, wherein a breakdown voltage of the first diode string is substantially equal to a breakdown voltage of the second diode string, or the breakdown voltage of the first diode string is less than a breakdown voltage of the first oxide layer.

12. The semiconductor power device of claim 1, further comprising:
a first metal wire, disposed on the interlayer dielectric layer; and
a second metal wire, disposed on the interlayer dielectric layer,
wherein the source electrode is coupled to the source region through the first metal wire, and the gate electrode is coupled to the first polysilicon structure through the second metal wire.

13. A semiconductor power device, comprising:
a lightly doped layer disposed on a substrate;
a first trench structure, comprising a first polysilicon structure and a first oxide layer surrounding the first polysilicon structure;
a second trench structure, comprising a second polysilicon structure and a second oxide layer surrounding the second polysilicon structure;
a third trench structure, comprising a third polysilicon structure and a third oxide layer surrounding the third polysilicon structure;
a first diode string, disposed between the second trench structure and the third trench structure and adjoining the second polysilicon structure and the third polysilicon structure;
a first spacing oxide layer, disposed on the first diode string; and
a second diode string, disposed on the first spacing oxide layer,
wherein the second diode string and the first diode string are connected in parallel between a gate electrode and a source electrode, and
wherein the gate electrode is electrically coupled to the first polysilicon structure and the third polysilicon structure, and the source electrode is electrically coupled to the second polysilicon structure.

14. The semiconductor power device of claim 13, wherein the first spacing oxide layer extends on a surface of the light doped layer covering the first polysilicon structure and the first oxide layer.

15. The semiconductor power device of claim 13, further comprising:
a second spacing oxide layer, disposed on the second spacing oxide layer and surrounding the second diode string.

16. The semiconductor power device of claim 15, wherein the first oxide layer adjoins the second oxide layer.

17. The semiconductor power device of claim 15, further comprising:
an interlayer dielectric layer disposed on the lightly doped layer,
wherein the first diode string, the second diode string and the second spacing oxide layer are disposed in the interlayer dielectric layer.

18. The semiconductor power device of claim 13, further comprising:
a first conductive plug, coupled to the source electrode and extending through a source doped region in the lightly doped layer and into a body doped region in the lightly doped layer;
a second conductive plug, extending through the second diode string and the first spacing oxide layer and into the first diode string, and coupling the source electrode to a first end of the first diode string and to a first end of the second diode string; and
a third conductive plug, extending through the second diode string and the first spacing oxide layer and into the first diode string,
wherein the second conductive plug couples the gate electrode to a second end of the first diode string and to a second end of the second diode string.

19. The semiconductor power device of claim 18, further comprising:
a first heavily doped region, disposed in the first end of the first diode string and surrounding an end of the first conductive plug; and
a second heavily doped region, disposed in the second end of the first diode string and surrounding an end of the second conductive plug.

20. The semiconductor power device of claim 13, further comprising:
a fourth conductive plug, coupled to a drain electrode and extending through a drain doped region in the lightly doped layer and into the lightly doped layer.

* * * * *